(12) United States Patent
Petti

(10) Patent No.: US 10,534,840 B1
(45) Date of Patent: Jan. 14, 2020

(54) MULTIPLICATION USING NON-VOLATILE MEMORY CELLS

(71) Applicant: SanDisk Technologies LLC, Addison, TX (US)

(72) Inventor: Christopher Petti, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/058,146

(22) Filed: Aug. 8, 2018

(51) Int. Cl.
| | |
|---|---|
| G11C 11/22 | (2006.01) |
| G06F 17/16 | (2006.01) |
| G11C 7/12 | (2006.01) |
| G11C 7/06 | (2006.01) |
| G06N 3/04 | (2006.01) |
| G11C 13/00 | (2006.01) |

(52) U.S. Cl.
CPC .............. *G06F 17/16* (2013.01); *G06N 3/04* (2013.01); *G11C 7/06* (2013.01); *G11C 7/12* (2013.01); *G11C 11/223* (2013.01); *G11C 11/2273* (2013.01); *G11C 11/2275* (2013.01); *G11C 13/004* (2013.01); *G11C 13/0069* (2013.01)

(58) Field of Classification Search
CPC ................................ G11C 11/22; G11C 11/16
USPC .................................................. 365/145, 158
See application file for complete search history.

(56) References Cited

U.S. PATENT DOCUMENTS

| | | | | |
|---|---|---|---|---|
| 5,014,235 A | * | 5/1991 | Morton .................... | G06F 5/015 365/185.11 |
| 9,813,232 B2 | * | 11/2017 | Katayama ............... | H04L 9/002 |
| 2005/0285862 A1 | * | 12/2005 | Noda .................... | G11C 7/1006 345/502 |
| 2009/0207642 A1 | * | 8/2009 | Shimano .................. | G11C 8/04 365/72 |
| 2011/0119215 A1 | | 5/2011 | Elmegreen et al. | |

(Continued)

FOREIGN PATENT DOCUMENTS

GB      2552014 A      10/2018

OTHER PUBLICATIONS

Garland et al., "Low Complexity Multiply Accumulate Unit for Weight-Sharing Convolutional Neural Networks", arXiv:1609.05132v4 [cs.NE], Jan. 19, 2017, 4 pages.

(Continued)

*Primary Examiner* — Michael T Tran
(74) *Attorney, Agent, or Firm* — Vierra Magen Marcus LLP

(57) ABSTRACT

Technology is described herein for performing multiplication using non-volatile memory cells. A multiplicand may be stored a node that includes multiple non-volatile memory cells. A multiplicand is stored a node that includes multiple non-volatile memory cells. Each memory cell in the node is connected to the same bit line, in one aspect. A multiply voltage may be applied to each memory cell in the node. Each memory cell in the node responds to the multiply voltage by passing a memory cell current to a bit line. The multiply voltage(s) are simultaneously applied to each memory cell in the node, such that the memory cell current of each memory cell flows in the bit line. The magnitude of the bit line current represents a product of the multiplier and the multiplicand. Vector/vector multiplication may be performed using "n" nodes of memory cells connected to the same bit line.

20 Claims, 16 Drawing Sheets

(56) References Cited

U.S. PATENT DOCUMENTS

| | | | | |
|---|---|---|---|---|
| 2013/0082232 | A1* | 4/2013 | Wu | H01L 45/08 |
| | | | | 257/5 |
| 2016/0283614 | A1* | 9/2016 | Bae | G06F 17/5072 |
| 2017/0200497 | A1* | 7/2017 | Pellizzer | G11C 13/0023 |
| 2017/0277659 | A1* | 9/2017 | Akerib | G06F 3/0644 |
| 2017/0315920 | A1* | 11/2017 | Andre | G11C 7/1039 |
| 2018/0374900 | A1* | 12/2018 | Pellizzer | H01L 45/06 |
| 2019/0088299 | A1* | 3/2019 | Antonyan | G11C 13/004 |
| 2019/0088328 | A1* | 3/2019 | Antonyan | G11C 7/08 |
| 2019/0115060 | A1* | 4/2019 | Deshpande | G11C 11/161 |
| 2019/0115532 | A1* | 4/2019 | Varesi | C01B 19/002 |
| 2019/0214433 | A1* | 7/2019 | Karpov | G11C 13/0002 |
| 2019/0244641 | A1* | 8/2019 | Jamali | G11C 7/065 |

OTHER PUBLICATIONS

Gong et al., "Signal and noise extraction from analog memory elements for neuromorphic computing", Nature Communications, Article DOI: 10.1038/s41467-018-04486-1, 2018, 8 pages.

Obradovic et al., "A Multi-Bit Neuromorphic Weight Cell Using Ferroelectric FETs, suitable for SoC Integration", Journal of the Electron Devices Society, 2018, vol. 8, 11 pages.

Prezioso, et al., "Training and Operation of an Integrated Neuromorphic Network Base on Metal-Oxide Memristors", Dec. 2014, 21 pages.

Agarwal, Sapan, et al., "Achieving Ideal Accuracies in Analog Neuromorphic Computing Using Periodic Carry," IEEE, Symposium on VLSI Technology, Jun. 2017, 2 pages.

\* cited by examiner

MULTIPLICATION USING NON-VOLATILE MEMORY CELLS

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may include non-volatile memory or volatile memory. A non-volatile memory device allows information to be stored or retained even when the non-volatile memory device is not connected to a source of power (e.g., a battery).

Examples of non-volatile memory include, but are not limited to, magnetoresistive memory (e.g., MRAM), phase change memory (e.g., PCM) ferroelectric field effect transistor (FeFET) memory, ferroelectric memory (e.g., FeRAM), and flash memory (e.g., NAND-type and NOR-type flash memory).

DETAILED DESCRIPTION

Figure 1A:
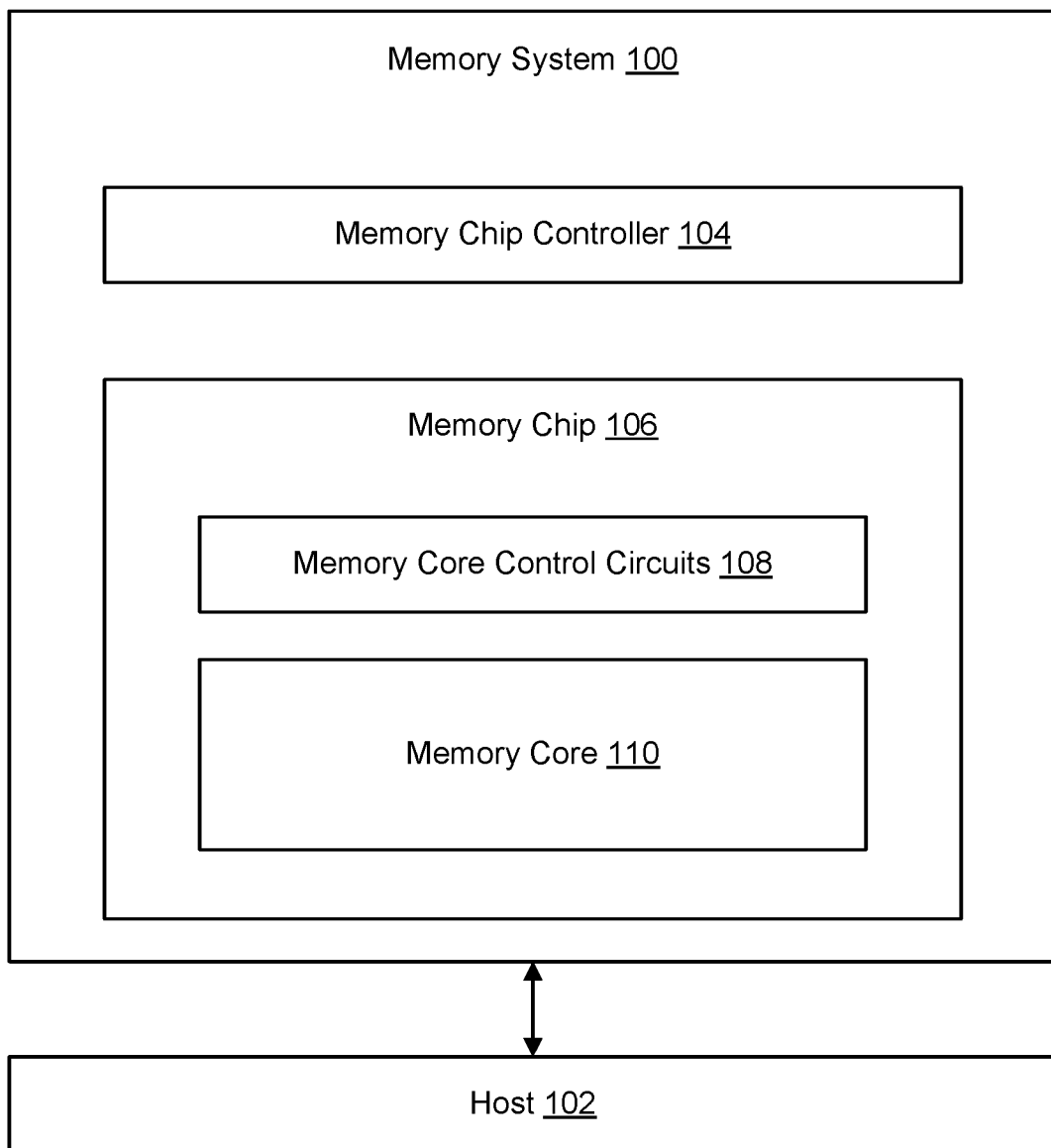
FIG. 1A depicts an embodiment of a memory system and a host.

Technology is described herein for performing multiplication using non-volatile memory cells. In one embodiment, vector/vector multiplication (e.g., vector dot product) is performed in a non-volatile memory system. A vector dot product is the summation of the products of the corresponding elements of two equal length vectors (where equal length refers to an equal number of elements). Hence, a vector dot product may also be referred to as a "multiply and accumulate" (MAC). In one embodiment, vector/matrix multiplication is performed in a non-volatile memory system. In one embodiment, non-volatile memory cells are used to perform multiplication in a neuromorphic computing system. A neuromorphic computing system may be used to implement an artificial neural network.

In one embodiment, a multiplicand is stored in a node that includes multiple non-volatile memory cells. Each memory cell in the node is connected to the same bit line, in one embodiment. The multiplicand is represented by bits in a binary number system, in one embodiment. Each memory cell in the node stores a different bit of the multiplicand, in one embodiment. For example, one memory cell stores the "1 s" position, another memory cell may store the "2s" position, and still another memory cell may store the "4s" position.

Each memory cell in the node has at least two terminals, such that a multiply voltage may be applied to each memory cell by applying a multiply voltage across the two terminals. In one embodiment, the magnitude of the multiply voltage is the same for each memory cell in a node. In one embodiment in which the multiply voltage is the same for each memory cell in a node, each memory cell in the node has a different magnitude on-current. In one embodiment, the magnitude of the multiply voltage is different for each memory cell in a node. In one embodiment, in which the magnitude of the multiply voltage is the different for each memory cell in a node, the on-current is the same for each memory cell in the node. In either case, the multiply voltage represents a multiplier.

Each memory cell in the node responds to the multiply voltage applied to the memory cell by passing a memory cell current to the bit line, in one embodiment. The term "memory cell current" refers to the current that passes through the memory cell to the bit line, in one embodiment or to a source line in another embodiment. The multiply voltage(s) are simultaneously applied to each memory cell in the node, such that the memory cell current of each memory cell passes to the bit line. The magnitude of the total bit line current represents a product of the multiplier and the multiplicand.

Vector/vector multiplication is performed using "n" nodes of memory cells connected to the same bit line, in one embodiment. Each node stores one element of a first vector of "n" elements. Each memory cell in a node stores a different bit of the element stored in that node, in one embodiment. A second vector is represented by "n" sets of one or more multiply voltages. Each set of multiply voltage(s) represents one element of the second vector. Each memory cell in the "n" nodes has one of the multiply voltages applied to it at the same time such that the memory cell current of each memory cell is provided to the bit line, in one embodiment. The magnitude of the bit line current represents a vector dot product of the first vector and the second vector. The vector dot product may also be referred to as a multiply and accumulate (MAC).

Vector/matrix multiplication is performed using "n×m" nodes of memory cells, in one embodiment. Vector/matrix multiplication may be performed by, in effect, performing "m" vector multiplications.

In some embodiments, each memory cell in the node is programmed to one of two physical states. Herein, a "physical state" may be referred to more briefly as a "state." For the sake of discussion, one state may be referred to as an "on-state" and the other state as an "off-state." The on-state may is a "high current state," whereas the off-state is a "low current state," in one embodiment. One state may be used to store a "1" and the other to store a "0." Thus, it may be stated that each memory cell stores one bit of information.

In one embodiment, the memory cells in the nodes are "binary non-volatile memory cells." A "binary non-volatile memory cell," as the term is defined herein, is a non-volatile memory cell that can be repeatedly switched between only two physical states. This is in contrast to a "multi-state non-volatile memory cell" which, as the term is defined herein, may be repeatedly switched between more than two physical states. Some types of non-volatile memory cells are well-suited for use as binary non-volatile memory cells, although they may not be well-suited for use as multi-state non-volatile memory cells. For example, some memory cells having a ferroelectric field effect transistor (FeFET) are well-suited for use as binary non-volatile memory cells. Also, some magnetoresistive memory (e.g., MRAM) is well-suited for use as binary non-volatile memory cells. However, some FeFETs and MRAM are not well-suitable for use as multi-state non-volatile memory cells.

Thus, "binary memory cells" may be used to perform multiplication. However, note that it is not required that binary memory cells be used. In some embodiments, a multi-state memory cell is used to perform multiplication. In some embodiments, the multi-state memory cells are each programmed to one of two physical states.

In order to achieve precise multiplication, both the multiplier and multiplicand should be able to represent multiple different values. It is not necessarily challenging to precisely generate a voltage that has one of multiple possible magnitudes. Hence, if the multiplier is represented by the magnitude of a voltage, a wide range of multipliers can precisely be achieved. Note that herein, the term "multiplier" is used for the multiply voltage, and the term "multiplicand" is used for the value stored in the node of memory cells. This is for convenience of discussion. The terms "multiplier" and "multiplicand," as used herein, are interchangeable.

However, it can be challenging to program non-volatile memory cells in a manner to precisely represent the multiplicand. For example, some memory cells have adjustable resistors that can be programmed to different resistances. Thus, such a memory cell might be programmed to one of, for example, eight different resistance states in order to represent a multiplicand. However, there should be a linear relationship between the resistance states in order for the multiplication to be precise. For many types of non-volatile memory cells, the relationship between the resistance states is non-linear.

One embodiment overcomes such limitations by storing a multiplicand in a selected node of multiple non-volatile memory cells, where each memory cell in the selected node stores a different bit of the multiplicand. Also, each memory cell in the node is connected to the same bit line, in one embodiment. A multiply voltage is simultaneously applied to each non-volatile memory cell in the selected node to cause each memory cell to pass a memory cell current, in one embodiment. The memory cell current may be passed to a bit line. The magnitude of the multiply voltage may be the same or different for each memory cell in the node. In either case, the magnitude of the multiply voltage may represent a multiplier. The magnitude of the total current (from all memory cells in the node) that flows in the bit line represents a product of the multiplier and the multiplicand.

In one embodiment, each memory cell in a node has a different physical size in order to represent a different bit of the multiplicand with the same magnitude multiply voltage. For the sake of illustration, each memory cell in the node may be programmed to one of two physical states. These two states may be referred to as an on-state (or high current state) and an off-state (or low current). Each memory cell in the node in the on-state passes a different magnitude current when the same magnitude multiply voltage is applied, in one embodiment. For example, if there are three memory cells in a node, a first memory cell may pass a current of "x micro-amperes," a second memory cell may pass a current of "2x micro-amperes," and a third memory cell may pass a current of "4x micro-amperes." This allows the node to represent different bits of a multiplicand, in one embodiment.

In one embodiment, each memory cell in a node has an adjustable resistor that can be programmed to different resistances. For example, a memory cell with an adjustable resistor can be programmed to either a high resistance state or a low resistance state in order to store one bit. The adjustable resistor of each memory cell in a node has a different cross-sectional area, in one embodiment. The magnitude of the on-current may be proportional to the cross-sectional area. Thus, memory cells with an adjustable resistor in the on-state pass a different magnitude current when the same magnitude multiply voltage is applied, in one embodiment. The magnitude of the off-current may also be proportional to the cross-sectional area. However, in one embodiment, the off-current is substantially lower than the on-current, such that the off-currents do not make a substantial contribution relative to the on-currents.

In one embodiment, each memory cell in a node has an adjustable threshold voltage (Vt) transistor that can be programmed to different threshold voltages. For example, a memory cell with an adjustable Vt transistor can be programmed to either a high Vt state or a low Vt state in order to store one bit. The high Vt state is a low current state, and the low Vt state is a high current state, in one embodiment. The adjustable Vt transistor of each memory cell in a node has a different width-to-length ratio (W/L), in one embodiment. The magnitude of the on-current may be proportional to the W/L. Thus, memory cells with adjustable Vt transistors in the on-state pass a different magnitude current when the same magnitude multiply voltage is applied, in one embodiment. In one embodiment, the adjustable Vt transistor on-currents of the memory cells in a node differ from each other by a power of two.

In one embodiment, each memory cell in a node receives a different magnitude multiply voltage. However, there is a precise relationship between the magnitudes of the multiply voltages such that each memory cell in the node stores a different bit a multiplicand, in one embodiment. For example, if there are three memory cells in a node, a first memory cell may receive a multiply voltage of "y volts" and pass a memory cell current of "x micro-amperes," a second memory cell may receive a multiply voltage of "2y volts" and pass a memory cell current of "2x micro-amperes," and a third memory cell may receive a multiply voltage of "4y volts" and pass a memory cell current of "4x micro-amperes." This allows the node to represent different bits of a multiplicand, in one embodiment.

Prior to further discussion of multiplication using non-volatile memory cells, an example memory system 100 in which embodiments may be practiced will be discussed. FIG. 1A depicts one embodiment of a memory system 100 and a host 102. Memory system 100 may include a non-volatile storage system interfacing with host 102 (e.g., a mobile computing device). In some cases, memory system 100 may be embedded within host 102. In other cases, memory system 100 may include a memory card. As depicted, memory system 100 includes a memory chip controller 104 and a memory chip 106. Although a single memory chip 106 is depicted, memory system 100 may include more than one memory chip (e.g., four, eight or some other number of memory chips). Memory chip controller 104 may receive data and commands from host 102 and provide memory chip data to host 102. In one embodiment, memory system 100 is used as a neuromorphic computing system.

Memory chip controller 104 may include one or more state machines, page registers, SRAM, and control circuitry for controlling the operation of memory chip 106. The one or more state machines, page registers, SRAM, and control circuitry for controlling the operation of memory chip 106 may be referred to as managing or control circuits. The managing or control circuits may facilitate one or more memory array operations, such as forming, erasing, programming, or reading (or sensing) operations. The managing or control circuits are used to perform multiplication using non-volatile memory cells, in one embodiment. Herein, multiplication will be referred to as a type of memory array operation.

In some embodiments, the managing or control circuits (or a portion of the managing or control circuits) for facilitating one or more memory array operations (including multiplication) may be integrated within memory chip 106. Memory chip controller 104 and memory chip 106 may be arranged on a single integrated circuit. In other embodiments, memory chip controller 104 and memory chip 106 may be arranged on different integrated circuits. In some cases, memory chip controller 104 and memory chip 106 may be integrated on a system board, logic board, or a PCB.

Memory chip 106 includes memory core control circuits 108 and a memory core 110. Memory core control circuits 108 may include logic for controlling the selection of memory blocks (or arrays) within memory core 110, controlling the generation of voltage references for biasing a particular memory array into a read or write state, or generating row and column addresses. Memory core control circuits 108 may include logic for controlling the generation of voltage references for biasing a particular memory array in order to perform multiplication using non-volatile memory cells.

Memory chip controller 104 controls operation of memory chip 106. Once a read, write, or multiply operation is initiated by memory chip controller 104, memory core control circuits 108 may generate the appropriate bias voltages for bit lines, source lines and/or word lines within memory core 110, and generate the appropriate memory block, row, and column addresses.

In some embodiments, one or more managing or control circuits may be used for controlling the operation of a memory array. The one or more managing or control circuits may provide control signals to a memory array to perform a read operation, a write operation and/or a multiply operation on the memory array. In one example, the one or more managing or control circuits may include any one of or a combination of control circuitry, state machine, decoders, sense amplifiers, read/write/multiply circuits, and/or controllers. The one or more managing circuits may perform or facilitate one or more memory array operations including erasing, programming, reading operations, or multiply operations. In one example, one or more managing circuits may include an on-chip memory controller for determining row and column address, bit line, source line and word line addresses, memory array enable signals, and data latching signals.

Memory core 110 may include one or more two-dimensional arrays of memory cells or one or more three-dimensional arrays of memory cells. In one embodiment, memory core control circuits 108 and memory core 110 are arranged on a single integrated circuit. In other embodiments, memory core control circuits 108 (or a portion of memory core control circuits 108) and memory core 110 may be arranged on different integrated circuits.

In one embodiment, memory core 110 comprises a three-dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate.

The exact type of memory array architecture or memory cell included in memory core 110 is not limited to the examples above. Many different types of memory array architectures or memory technologies can be used to form memory core 110. No particular non-volatile memory technology is required for purposes of the new claimed embodiments proposed herein. Other examples of suitable technologies for memory cells of the memory core 110 include ReRAM memories, ferroelectric field effect transistor (FeFET) memory, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory core 110 include two dimensional arrays, three dimensional arrays, cross-point arrays, stacked two dimensional arrays, vertical bit line arrays, and the like.

One example of a ReRAM, or PCMRAM, cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A ferroelectric field effect transistor (FeFET) memory has an adjustable threshold voltage (Vt) transistor that has an adjustable threshold voltage. The adjustable Vt transistor has a low threshold voltage state and a high threshold voltage state, in one embodiment. The adjustable Vt transistor can be repeatedly switched between the low threshold voltage state and the high threshold voltage state.

A person of ordinary skill in the art will recognize that the technology described herein is not limited to a single specific memory structure, but covers many relevant memory structures within the spirit and scope of the technology as described herein and as understood by one of ordinary skill in the art.

Figure 1B:
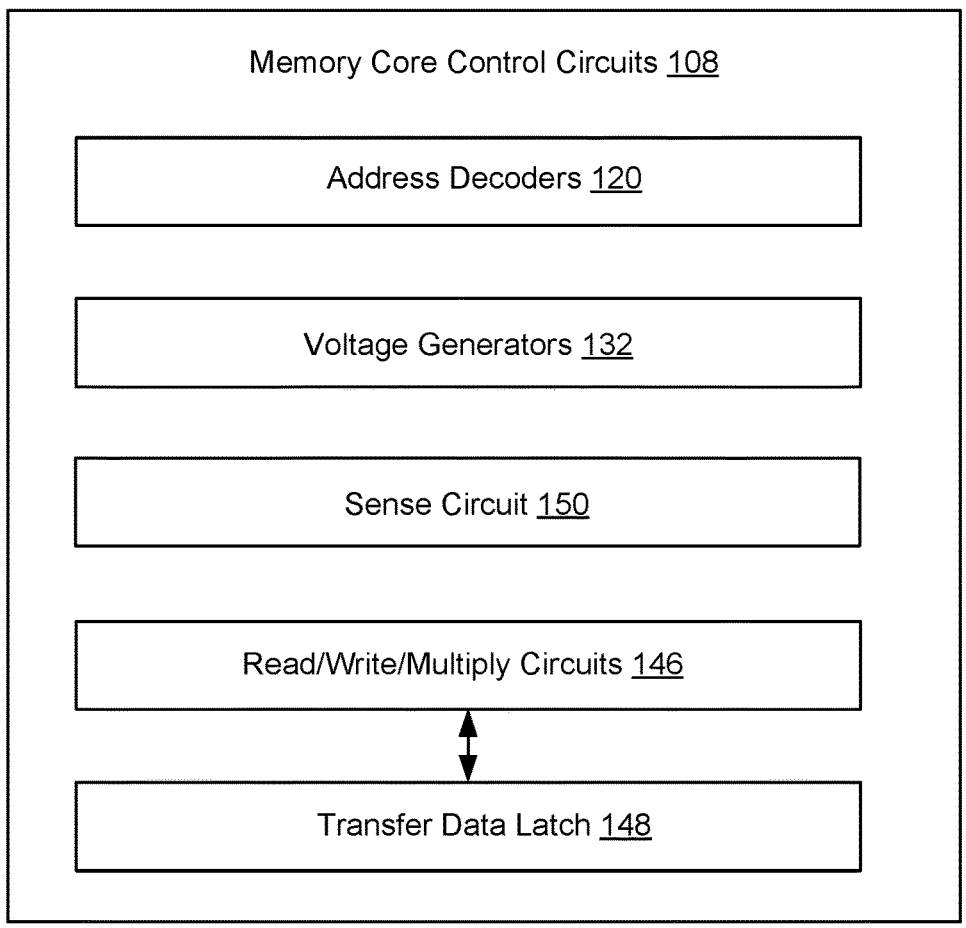
FIG. 1B depicts an embodiment of memory core control circuits.

FIG. 1B depicts an embodiment of memory core control circuits 108. As depicted, memory core control circuits 108 include address decoders 120, voltage generators 132, transfer data latch 148, read/write/multiply circuits 146, and sense circuit 150. The voltage generators (or voltage regulators) 132 may generate voltages for control lines.

Read/write/multiply circuits 146 include circuitry for reading and writing memory cells in the memory core 110. In an embodiment, transfer data latch 148 is used for intermediate storage between memory chip controller 104 (FIG. 1A) and memory cells. In an embodiment, when host 102 instructs memory chip controller 104 to write data to memory chip 106, memory chip controller 104 writes host data to transfer data latch 148. Read/write circuits 146 then write data from transfer data latch 148 to a specified page of memory cells. In an embodiment, transfer data latch 148 has a size equal to the size of a page. In an embodiment, when host 102 instructs memory chip controller 104 to read data from memory chip 106, read/write circuits 146 read from a specified page into transfer data latch 148, and memory chip controller 104 transfers the read data from transfer data latch 148 to host 102. Address decoders 120 may generate memory block addresses, as well as row addresses and column addresses for a particular memory block.

The read/write/multiply circuits 146 also include circuitry for performing multiply operations using memory cells. In one embodiment, the write circuit is used to store multiplicands in the memory cells. The write circuit stores a multiplicand into a node of "r" memory cells, in one embodiment. In one embodiment, the multiplicand has "r" bits. Each memory cell in a node stores one of the "r" bits of the multiplicand, in one embodiment.

In one embodiment, the multiply circuit is used to apply multiply voltages to memory cells that store multiplicands. Each multiply voltage has a magnitude that represents a multiplier, in one embodiment. Each memory cell in a node passes memory cell current in response to the multiply voltage. The magnitude of the memory cell current depends on the physical state of the memory cell and a magnitude of the multiply voltage, in one embodiment. For example, the magnitude of a memory cell current depends on the resistance of the memory cell and the voltage applied to the memory cell, in one embodiment. The magnitude of the memory cell current depends on whether the memory cell is in a first physical state or a second physical state, in one embodiment. Each physical state may be represented by a physical parameter including, but not limited to, a memory cell resistance, or a memory cell transistor threshold voltage.

The multiply voltage may be similar in magnitude to a read voltage, in that the multiply voltage may cause the memory cell to pass the memory cell current without changing the physical state of the memory cell. However, whereas a read voltage may have a magnitude that is selected to delineate between physical states, the magnitude of the multiply voltage is not necessarily selected to delineate between physical states. The following examples of a memory cell programmed to one of two states will be used to illustrate. After a read voltage is applied, the memory cell current may be sensed and compared with a reference current to determine which state the memory cell is in. In this case, the magnitude of the read voltage and reference current may be selected to be able to delineate between the two states. However, the multiply voltage could have one of many different magnitudes, depending on what multiplier is desired. Moreover, the memory cell current that results from applying the multiply voltage is not necessarily compared to a reference current.

The sense circuit 150 is configured to sense the memory cell currents. The sense circuit 150 comprises a number of sense amplifiers, in one embodiment. A sense amplifier may be used to sense a current in a bit line, in one embodiment. In some embodiments, a number of memory cells are connected to the same bit line. Depending on how voltages are applied to the memory cells by the read or multiply circuit, the current from one or more memory cells may flow in the bit line. Thus, a sense amplifier may be used to sense the memory cell current from a single memory cell, or the combined memory cell current from multiple memory cells connected to the same bit line. The sense amplifier may also be configured to compare the magnitude of the bit line current to the magnitude of a reference current.

Figure 1C:
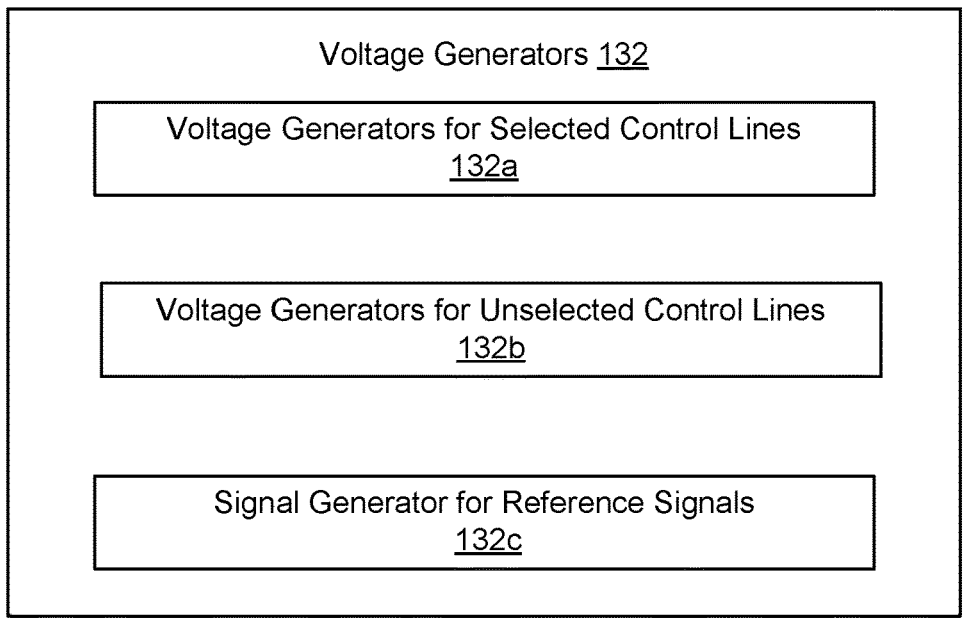
FIG. 1C depicts further details of one embodiment of voltage generators.

FIG. 1C depicts further details of one embodiment of voltage generators 132. The voltage generators include voltage generators for selected control lines 132a, voltage generators for unselected control lines 132b, and signal generators for reference signals 132c. Control lines may include bit lines, source lines and word lines, or a combination of bit lines, source lines and word lines. Voltage generators for selected control lines 132a may be used to generate program, read, and/or multiply voltages. In one embodiment, the voltage generators for selected control lines 132a generate a voltage whose magnitude is based on a multiplier for a mathematical multiplication operation. In one embodiment, the voltage difference between the voltages for two selected control lines is a multiply voltage.

Voltage generators for unselected control lines 132b may be used to generate voltages for control lines that a connected to memory cells that are not selected for a program, read, or multiply operation. The signal generators for reference signals 132c may be used to generate reference signals (e.g., currents, voltages) to be used as a comparison signal to determine the physical state of a memory cell.

Figure 2A:
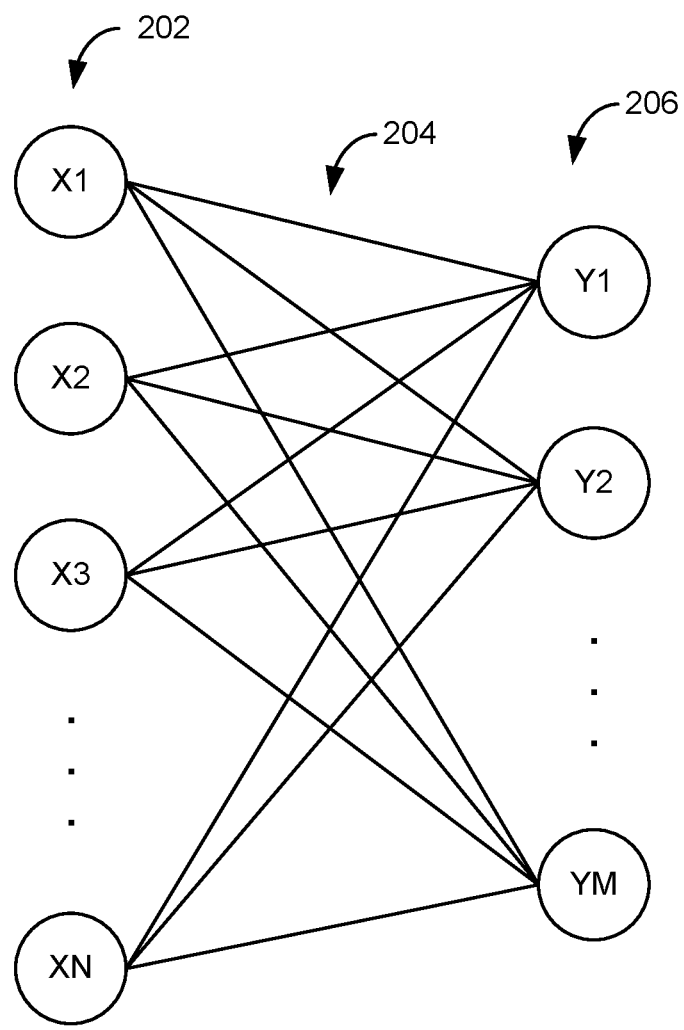
FIG. 2A shows an example of an N to M artificial neural network.

In one embodiment, non-volatile memory cells are used to perform multiplication in a neuromorphic computing system. A neuromorphic computing system may be used to implement an artificial neural network. FIG. 2A shows an example of an N to M artificial neural network 200. The artificial neural network 200 has "N" input neurons 202 and "M" output neurons 206. A number of synapses 204 connect input neurons 202 to output neurons 206. Each of the input neurons 202 may be associated with a mathematical number. Likewise, each of the synapses 204 may be associated with a mathematical number, which is typically referred to as a "weight." Equation 1 represents a calculation that may be performed for each of the "M" output neurons 206.

$$Y_M = \Sigma_1^N X_N \times W_{NM} \qquad \text{Eq. 1}$$

In Equation 1, $Y_M$ represents the output neuron 206 for which Equation 1 is presently being applied; $X_N$ represents the input neurons 202; and $W_{NM}$ represents the weight of the synapse 204 that connects one input neuron 202 to the output neuron 206 for which Equation 1 is presently being applied ($Y_M$). As noted above, each synapse has a "weight". Thus, Equation 1 may be implemented by a multiply and accumulate of the product of the values of the N input neuron 202 by the weight of the synapse 204 that connects each respective input neuron 202 to $Y_M$. The multiply and accumulate can also be referred to as a vector/vector multiply (e.g., dot product of two vectors). The first vector being an "n" element vector defined by the values for the N input neuron 202, and the second vector being an "n" element vector defined by the weights of the N synapses 204 that connect the N input neurons 202 to $Y_M$.

Figure 2B:
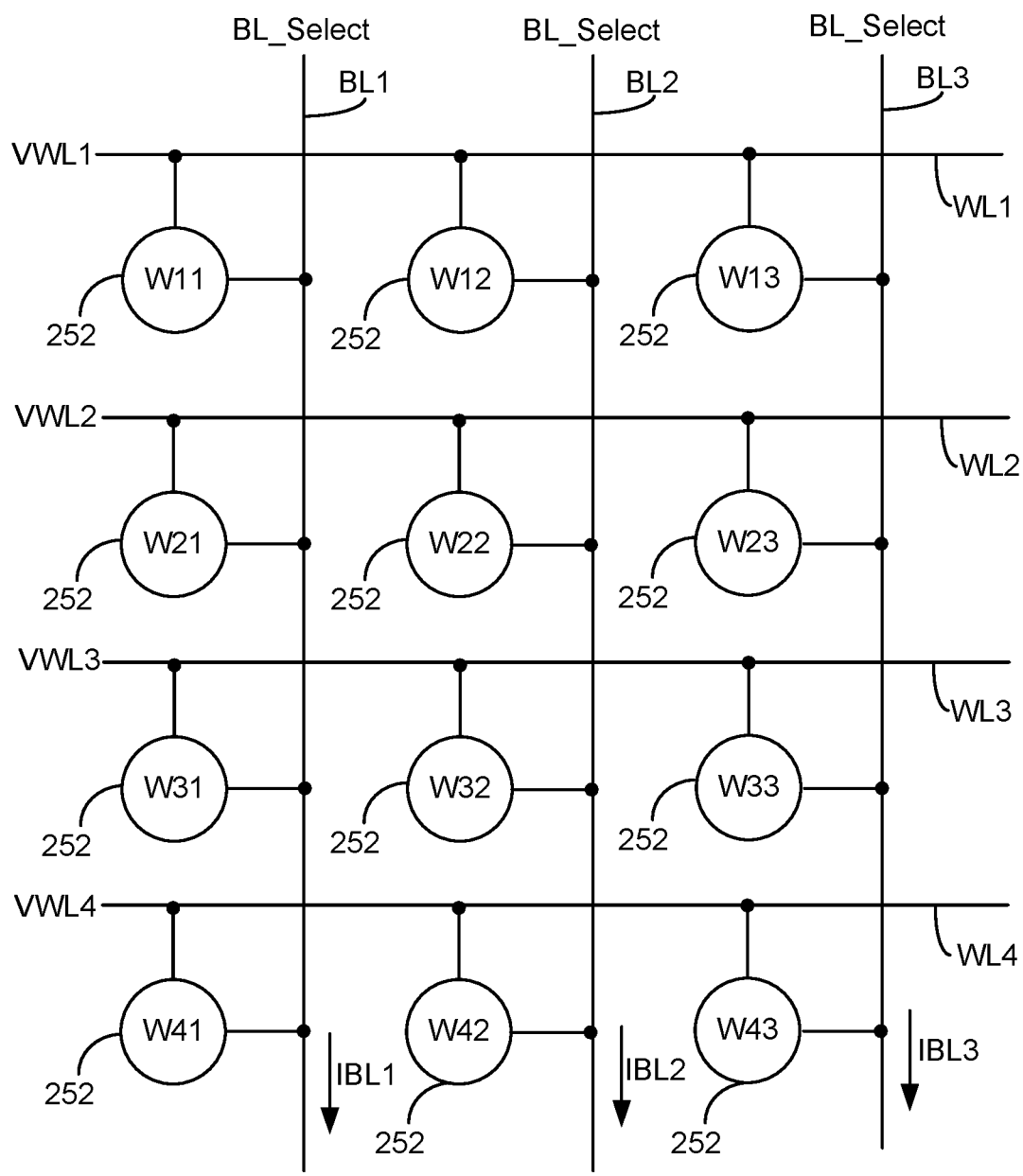
FIG. 2B depicts an example of a portion of a cross-point memory array.

One technique for performing the multiply and accumulate (or vector/vector multiply) is to use a cross-point memory array. FIG. 2B depicts an example of a portion of a cross-point memory array 250. The cross-point memory array 250 may be used to perform a multiply and accumulate operation. The depicted portion of the array 250 has four word lines (WL1, WL2, WL3, WL4) and three bit lines (BL1, BL2, BL3). The depicted portion of the array 250 may be used to execute Equation 1 for a case in which N=4 and M=3.

A number of non-volatile memory cells 252 are depicted. Each non-volatile memory cells 252 could include an adjustable resistor, as one example. Each memory cell 252 is labeled with a weight (e.g., W11, W21, etc.). These weights ($W_{NM}$) correspond to the weights that represent the synapse 204 that connects one input neuron 202 to the output neuron 206. For some types of memory cells, the adjustable resistor can be programmed to a range of resistances. Thus, the weight may be related to the resistance of the adjustable resistor.

Voltages VWL1, VWL2, VWL3, and VWL4 are shown being applied to the respective word lines WL1, WL2, WL3, WL4. The magnitudes of these voltages correspond to the input neurons 202. Thus, the set of voltages VWL1, VWL2, VWL3, and VWL4 correspond to $X_N$ in Equation 1. A bit line select voltage (BL_Select) is applied to each bit line to select that bit line. For ease of explanation, it will be assumed that BL_Select is zero volts, such that the voltage across each memory cell 252 is the word line voltage. Each memory cell 252 may pass a current that is based on its resistance and the voltage applied to the memory cell. This "memory cell current" flows to the bit line connected to the memory cell 252. The memory cell current may be viewed as the product of multiplying a mathematical value represented by the word line voltage by a mathematical value represented by the resistance of the memory cell. Stated another way, the memory cell current may be viewed as a representation of the product of multiplying one of the elements of an input vector by the weight stored in the memory cell.

A number of bit line currents (IBL1, IBL2, IBL3) are depicted. Each bit line current is the summation of the currents of the memory cells connected to that bit line. Thus, each bit line current may be viewed as representing an accumulation of the products discussed in the prior paragraph. Therefore, the magnitude of a bit line current may be viewed to represent a vector/vector multiplication (e.g., dot product of two vectors). Furthermore, with reference to Equation 1, the magnitude of a bit line current may represent one of the output neurons (e.g., $Y_M$).

For the architecture in FIG. 2B, in order for the multiply and accumulate to be precise, the weights should be able to have a variety of values. However, some memory cells can only be reliably programmed to two states. Hence, such memory cells may not be suitable for multiply and accumulate in the architecture in FIG. 2B. Some memory cells can be programmed to more than two states. For example, some adjustable resistance memory cells can be programmed to more than two resistances. However, for such multi-state memory cells to produce precise MAC in the architecture in FIG. 2B, there should be a linear relationship between the resistance states. Unfortunately, many multi-state memory cells exhibit a non-linear relationship between the resistance states. Therefore, accuracy in MAC may be imprecise when such memory cells are used in the architecture in FIG. 2B.

Figure 3A:
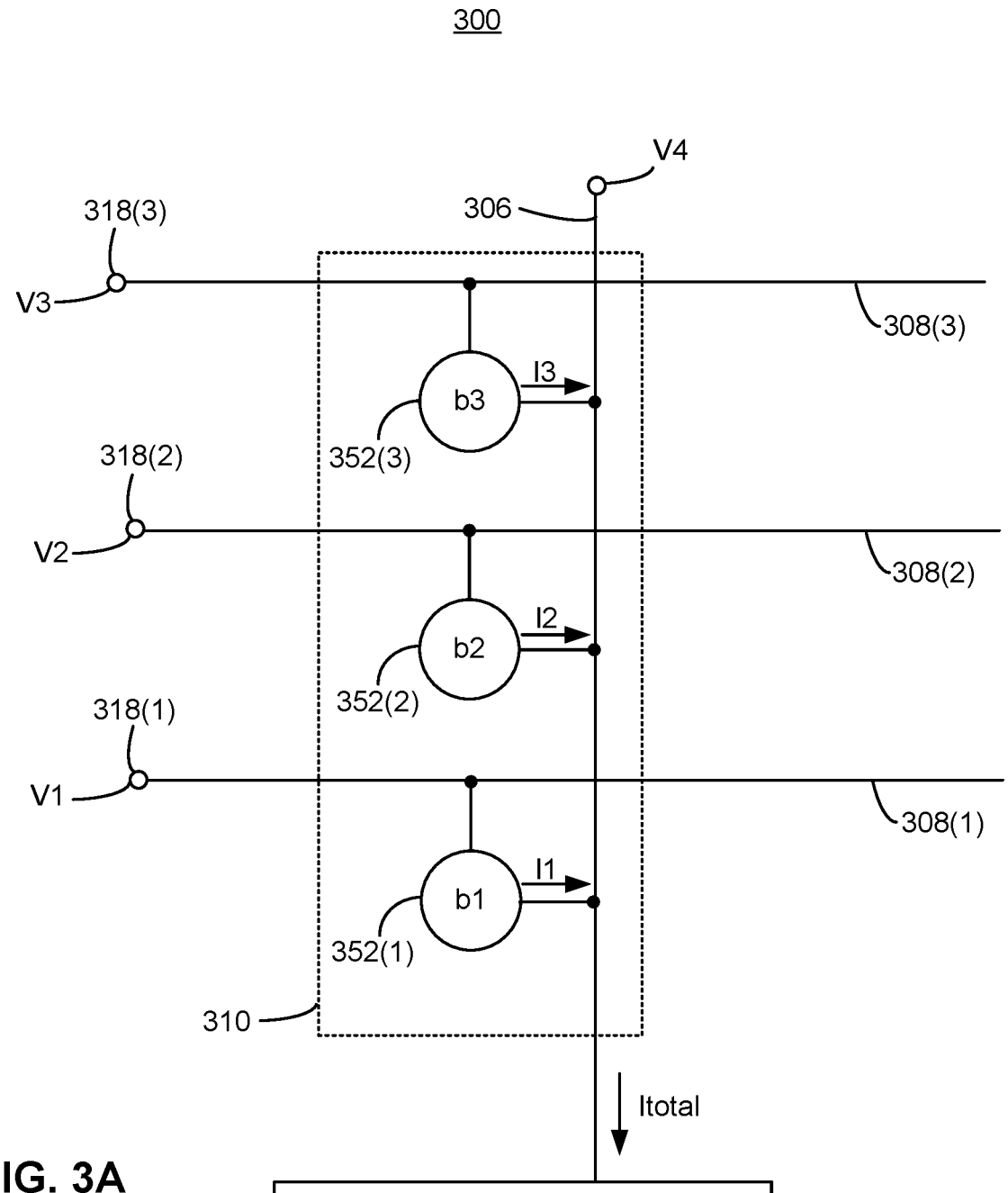
FIG. 3A is a diagram of one embodiment of an apparatus that may be used to perform multiplication.

FIG. 3A is a diagram of one embodiment of an apparatus 300 that may be used to perform multiplication. The apparatus 300 may be included in a non-volatile storage device. The apparatus is contained within memory system 100, in one embodiment. The apparatus resides on memory chip 106, in one embodiment. FIG. 3 shows one node 310 in a cross-point memory array. The cross-point memory array typically has additional nodes 310. For example, there may be rows and columns of nodes 310. In the embodiment of FIG. 3A, there are three memory cells 352(1), 352(2), 352(3) in the node 310. The reference numeral 352 may be used to refer to a memory cell without reference to a specific memory cell. In general, there may be two or more memory cells 352 in the node 310. A node 310 is a unit of two or more memory cells 352 that may be used to multiply two mathematical values. One mathematical value is stored in the node 310, and the other mathematical value is represented by whatever voltage or voltages is/are applied to each memory cell 352 in the node.

Each memory cell 352 is electrically connected to one of the first conductive lines 308(1), 308(2), 308(3). The reference numeral 308 will be used to refer to a first conductive line without reference to a specific first conductive line. In one embodiment, the first conductive lines 308 are referred to as word lines. There is a second conductive line 306 electrically connected to each memory cell 352. In one embodiment, the second conductive line 306 is referred to as a bit line. Each memory cell 352 in the node 310 is a different physical row of a cross-point array, in one embodiment. However, the node 310 is part of one data row, in one embodiment.

Each memory cell 352 is programmed to one of two different states, in one embodiment. These two states may be referred to as a high current state and a low current state, in one embodiment. For the sake of discussion, a memory cell in the high current state store a "1" and a memory cell in the low current state may store a "0". Thus, it may be stated that each memory cell 352 stores one bit. In one embodiment, each memory cell 352 has an adjustable resistor, and the two different states are two different resistances (or alternatively conductances). In one embodiment, each memory cell 352 has a transistor with an adjustable Vt, and the two different states are two different transistor threshold voltages.

The memory cells 352 in the node 310 may be used to collectively store a mathematical value, in one embodiment. In one embodiment, the memory cells 352 in the node 310 collectively store a multiplicand. The multiplicand may be a weight in a neural network. In one embodiment, each memory cell 352 in the node 310 stores a different bit of the multiplicand. The different bits are labeled as "b1", "b2" and "b3", inside of the memory cells 352. Each bit may represent a different position in a binary number system, and hence has a different weight. For example, memory cell 352(1) may represent the "1s" position, memory cell 352(2) may represent the "2s" position, and memory cell 352(3) may represent the "4s" position. Thus, the memory cells in the node 310 may collectively store three bits of information, in one embodiment.

In one embodiment, each memory cell 352 stores a set of two of more bits of the multiplicand. For example, if each memory cell 352 stores two bits, then memory cell 352(1) may represent the "1s" and "2s" position, memory cell 352(2) may represent the "4s" and "8s" position, and memory cell 352(3) may represent the "16s" and "32s" position. Thus, the memory cells three in the node 310 may collectively store six bits of information, in one embodiment. An example of storing two bits per memory cell 352 is further discussed with respect to FIG. 9.

The number of memory cells 352 in a node 310 relates to the resolution of the multiplicand, in one embodiment. For example, the multiplicand may be a value between 0 and 1, such that with three bits the node 310 can represent the following values (0, 0.125, 0.25, 0.375, 0.5, 0.625, 0.75, 0.825). Adding more memory cells 352 to the node 310 can achieve greater resolution for the multiplicand over the same range. The range between 0 and 1 is just one example, as are the example values within the range.

The multiply circuit 146 is configured to apply a multiply voltage to each memory cell. The phrase, "apply a multiply voltage to a memory cell," or the like, means to apply the multiply voltage across two terminals of the memory cell. Moreover, applying a multiply voltage to a memory cell results in a memory cell current that has a magnitude that depends on the physical state (e.g., resistance, Vt) of the memory cell and the magnitude of the multiply voltage. In one embodiment, the magnitude of the memory cell current is a function of the resistance of an adjustable resistor in the memory cell and the magnitude of the multiply voltage. In one embodiment, the magnitude of the memory cell current is a function of the Vt of a transistor in the memory cell and the magnitude of the multiply voltage. The phrase, "apply a multiply voltage to a node," means to apply the same magnitude multiply voltage to each memory cell in the node. The phrase, "apply one or more multiply voltages to a node," means to apply the same magnitude multiply voltage or different magnitude multiply voltages to each memory cell in the node, with the one or more multiply voltages representing the same multiplier.

A multiply voltage may be applied between one of the first conductive lines 308 and the second conductive line 306 in order to apply the multiply voltage to a memory cell, in the embodiment of FIG. 3A. Each first conductive line 308 has a first terminal 318(1), 318(2), or 318(3) to which the multiply circuit 146 applies a voltage, in one embodiment.

In the embodiment of FIG. 3A, V1 is applied to first conductive line 308(1) while V4 is applied to the second conductive line 306, resulting in a first multiply voltage is given by V1-V4, in one embodiment. V2 is applied to first conductive line 308(2) while V4 is applied to the second conductive line 306, resulting in a second multiply voltage is given by V2-V4, in one embodiment. V3 is applied to first conductive line 308(3) while V4 is applied to the second conductive line 306, resulting in a third multiply voltage is given by V3-V4, in one embodiment. In one embodiment, the magnitude of V1, V2, and V3 are each the same as each other. In one embodiment, the magnitude of V1, V2, and V3 are each different from each other.

In one embodiment, the magnitude of the multiply voltage that is applied to a memory cell 352 represents a multiplier. The same multiplier is used for each memory cell in a node 310, in one embodiment. However, this does not necessarily mean that the multiply voltage has the same magnitude for each memory cell 352 in the node 310. As one example, multiply voltages have ratios 4:2:1 may be used to represent the same multiplier. In this example, the highest magnitude multiplier voltage may be applied to the memory cell 352 that stores the most significant bit of the multiplicand, with the lowest magnitude multiply voltage applied to the memory cell 352 that stores the least significant bit of the multiplicand.

In one embodiment, the magnitude of each multiply voltage is selected such that each memory cell current represents a product of the multiplier and a bit of the multiplicand stored in that memory cell. For example, consider the example in which all memory cells 352(1), 352(2), 352(3) are in a high current state. In this example, each memory cell stores a "1" in its position of the multiplicand. In this case, memory cell 352(1) may pass a current of "x micro-amperes," in response to the multiply voltage applied to memory cell 352(1); memory cell 352(2) may pass a current of "2x micro-amperes," in response to the multiply voltage applied to memory cell 352(2); and memory cell 352(3) may pass a current of "4x micro-amperes, in response to the multiply voltage applied to memory cell 352(3)." The effect is that each memory cell current represents a product of the same multiplier and a bit of the multiplicand stored in that memory cell. In general, increasing the magnitude of the multiply voltages increases the memory cell currents. In one embodiment, the memory cell on-current has a linear relationship with the multiply voltage. Hence, the magnitudes of the multiply voltages may be adjusted in order to represent different multipliers. In a low current state, the memory cell currents may also have a similar relationship (e.g., 4:2:1 relationship), but the currents may be much lower. The foregoing allows the node 310 to represent different bits of a multiplicand, in one embodiment.

Each memory cell 352 causes a current (referred to as a memory cell current) in the second conductive line 306 in response to the multiply voltage applied to that memory cell, in one embodiment. For example, memory cell 352(1) may provide current I1 to the second conductive line 306, memory cell 352(2) may provide current I2 to the second conductive line 306, and memory cell 352(3) may provide current I3 to the second conductive line 306. Each of the memory cell currents (I1, I2, I3) combine in the second conductive line 306 as a result of the multiply voltages being applied simultaneously. The sum of I1+I2+I3 is labeled as Itotal, which is sensed by the sense circuit 150. The magnitude of Itotal represents a product of the multiplier represented by the multiply voltages and the multiplicand stored in the node 310.

The way in which the current Itotal is analyzed and used may depend on the application. The current Itotal is an analog signal. In one embodiment, Itotal is input to an analog-to-digital converter (A/D), which may generate a multi-bit signal whose value reflects the magnitude of Itotal. Thus, the multi-bit signal is the product of the multiplier and the multiplicand, in one embodiment. However, it is not required that Itotal be converted to a digital signal. In one embodiment, the sense circuit 150 compares the magnitude of Itotal to a reference current. The sense circuit 150 may output a results signal (e.g., one bit of information) that indicates whether Itotal is less than or greater than the reference current. The foregoing are two examples of results signals that could be output by the sense circuit 150. In one embodiment, the magnitude of Itotal is input to an activation function in an artificial neural network. In some applications, the activation function outputs a "fire" or "don't fire" signal based on the magnitude of Itotal.

The apparatus 300 provides for very precise multiplication. For many memory cells, the memory cells can be reliably programmed to one of two physical states, where the physical state has precise physical value. For example, a memory cell with an adjustable resistor can be programmed to either a high resistance state or a low resistance state, wherein there may be relatively little cell to cell variation in the resistance of the high resistance state, and relatively little cell to cell variation in the resistance of the low resistance state. The terms "high resistance state" and "low resistance state," when used together means that the high resistance state has a higher resistance than the low resistance state. In one embodiment, the low resistance state is referred to as a "SET" state and the high resistance is referred to as a "RESET" state. As another example, a memory cell with an adjustable transistor threshold voltage can be programmed to either a high threshold voltage state or a low threshold voltage state, wherein there may be relatively little cell to cell variation in the threshold voltage of the high threshold voltage state, and relatively little cell to cell variation in the threshold voltage of the low threshold voltage. The terms "high threshold voltage state" and "low threshold voltage state," when used together means that the high threshold voltage state has a higher threshold voltage than the low threshold voltage state. Thus, each memory cell 352 should exhibit a similar memory cell current when it is in the low physical state (e.g., low resistance or low threshold voltage). Likewise, each memory cell 352 should exhibit a similar memory cell current when it is in the high physical state (e.g., high resistance or high threshold voltage).

The number of memory cells 352 per node 310 may vary depending on the application. In one embodiment, the nodes 310 are used during a learning operation in an artificial neural network. In a learning operation, it may be desirable to have more memory cells 352 per node 310 for high accuracy. For example, there might be six memory cells 352 per node 310 for a learning operation (which provides for six bits of resolution in the weights, in one embodiment). In one embodiment, the nodes 310 are used during an inference operation in an artificial neural network. In an inference operation fewer memory cells 352 per node 310 may suffice. For example, there might be two memory cells 352 per node 310 for a learning operation. In one embodiment, the nodes 310 are used for both a learning operation and an inference operation. In this case, it may be acceptable to truncate the weights that were learned during the learning operation, wherein some of the memory cells in the node are not used during the inference operation, in one embodiment. However, all memory cells in the node could be used for both learning the weights and using the weights in the inference operation.

Figure 3B:
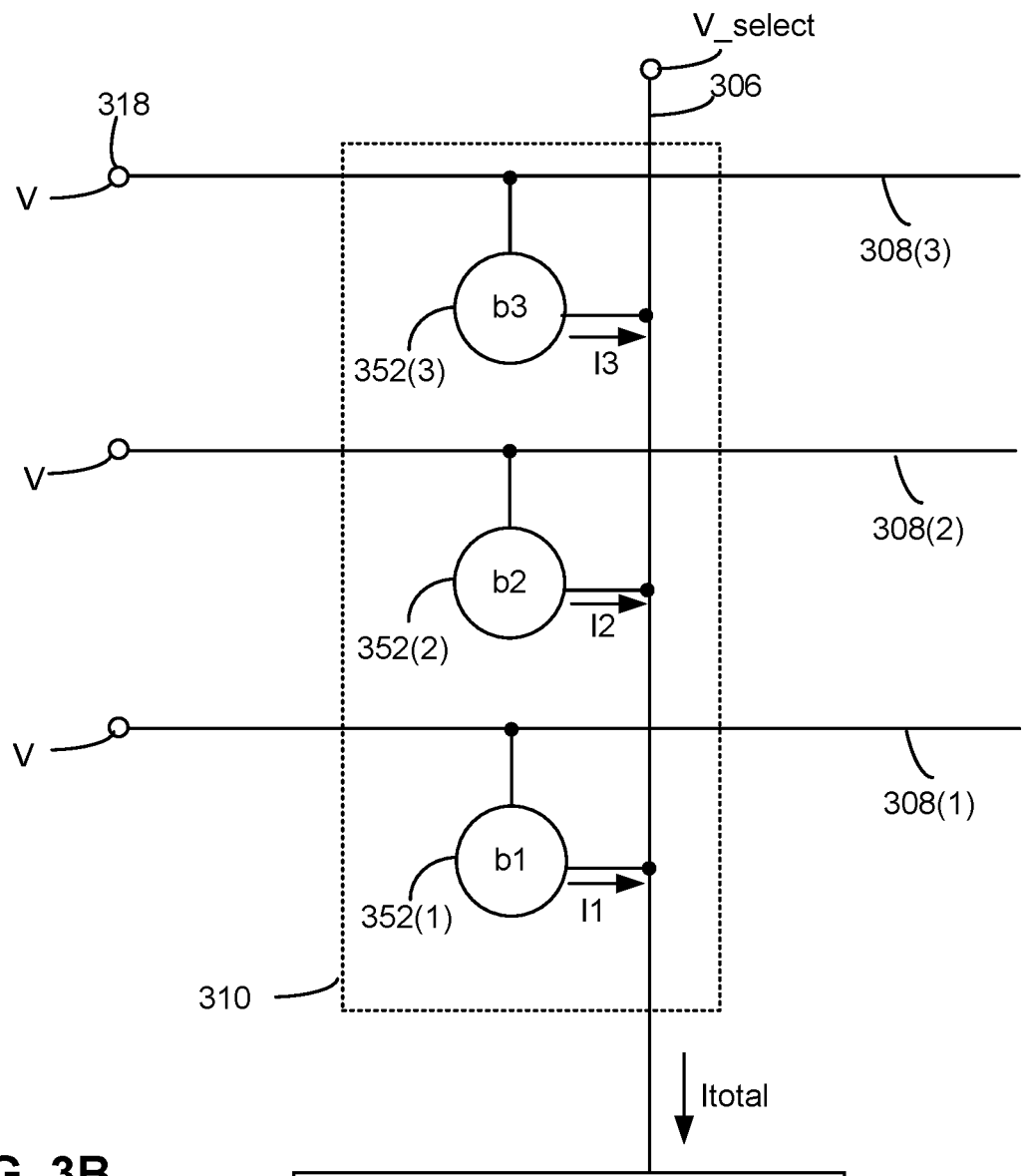
FIG. 3B is a diagram of one embodiment of an apparatus that is used to perform multiplication using different size non-volatile memory cells in a node.
Figure 3B:
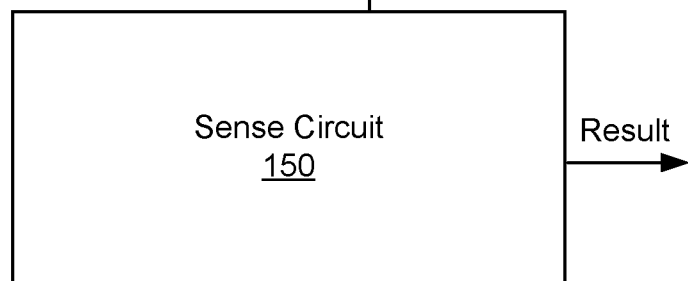

FIG. 3B is a diagram of one embodiment of an apparatus 320 that is used to perform multiplication using non-volatile memory cells. In one embodiment, each memory cell 352 in the node 310 has a different size in order to represent a different bit of a multiplicand in response to the same magnitude multiply voltage. As depicted in FIG. 3B, the voltage V is applied to all three first conductive lines 308(1), 308(2), and 308(3). A select village V_select is applied to the second conductive line 306. Thus, each multiply voltage is given by V-V_Select.

Each memory cell 352 in the node 310 in the same physical state passes a different magnitude current when the same magnitude multiply voltage is applied, in one embodiment. For example, assuming all memory cells are in a high current state, then in response to the same magnitude multiply voltage, memory cell 352(1) may pass a current of "x micro-amperes," memory cell 352(2) may pass a current of "2x micro-amperes," and a memory cell 352(3) may pass a current of "4x micro-amperes." In a low current state, the memory cell currents may also have a similar relationship, but the currents may be much lower. The foregoing allows the node 310 to represent different bits of a multiplicand, in one embodiment.

In one embodiment, each memory cell 352 in the node 310 has an adjustable resistor that can be programmed to different resistances. For example, a memory cell with an adjustable resistor can be programmed to either a high resistance state or a low resistance state in order to store one bit. The low resistance state is a high current state and the high resistance state is a low current state, in one embodiment. The adjustable resistor of each memory cell 352 has a different cross-sectional area, in one embodiment. The magnitude of the memory cell current may be proportional to the cross-sectional area. Thus, memory cells with an adjustable resistor in the same physical state pass a different magnitude current when the same magnitude multiply voltage is applied, in one embodiment. For example, when in the low resistance state, memory cell 352(1) may pass a current of "x micro-amperes," memory cell 352(2) may pass a current of "2x micro-amperes," and a memory cell 352(3) may pass a current of "4x micro-amperes," assuming the same magnitude multiply voltage applied to each memory cell.

In one embodiment, each memory cell 352 in the node 310 has an adjustable threshold voltage (Vt) transistor that can be programmed to different threshold voltages. For example, a memory cell with an adjustable Vt transistor can be programmed to either a high Vt state or a low Vt state in order to store one bit. The low Vt state is a high current state and the high Vt state is a low current state, in one embodiment. The adjustable Vt transistor of each memory cell in a node has a different width to length ratio (W/L), in one embodiment. The magnitude of the current may be proportional to the W/L. Thus, memory cells with adjustable Vt transistors in the same physical state pass a different magnitude current when the same magnitude multiply voltage is applied, in one embodiment. For example, when in low Vt state, memory cell 352(1) may pass a current of "x micro-amperes," memory cell 352(2) may pass a current of "2x micro-amperes," and a memory cell 352(3) may pass a current of "4x micro-amperes," assuming the same magnitude multiply voltage applied to each memory cell.

Figure 3C:
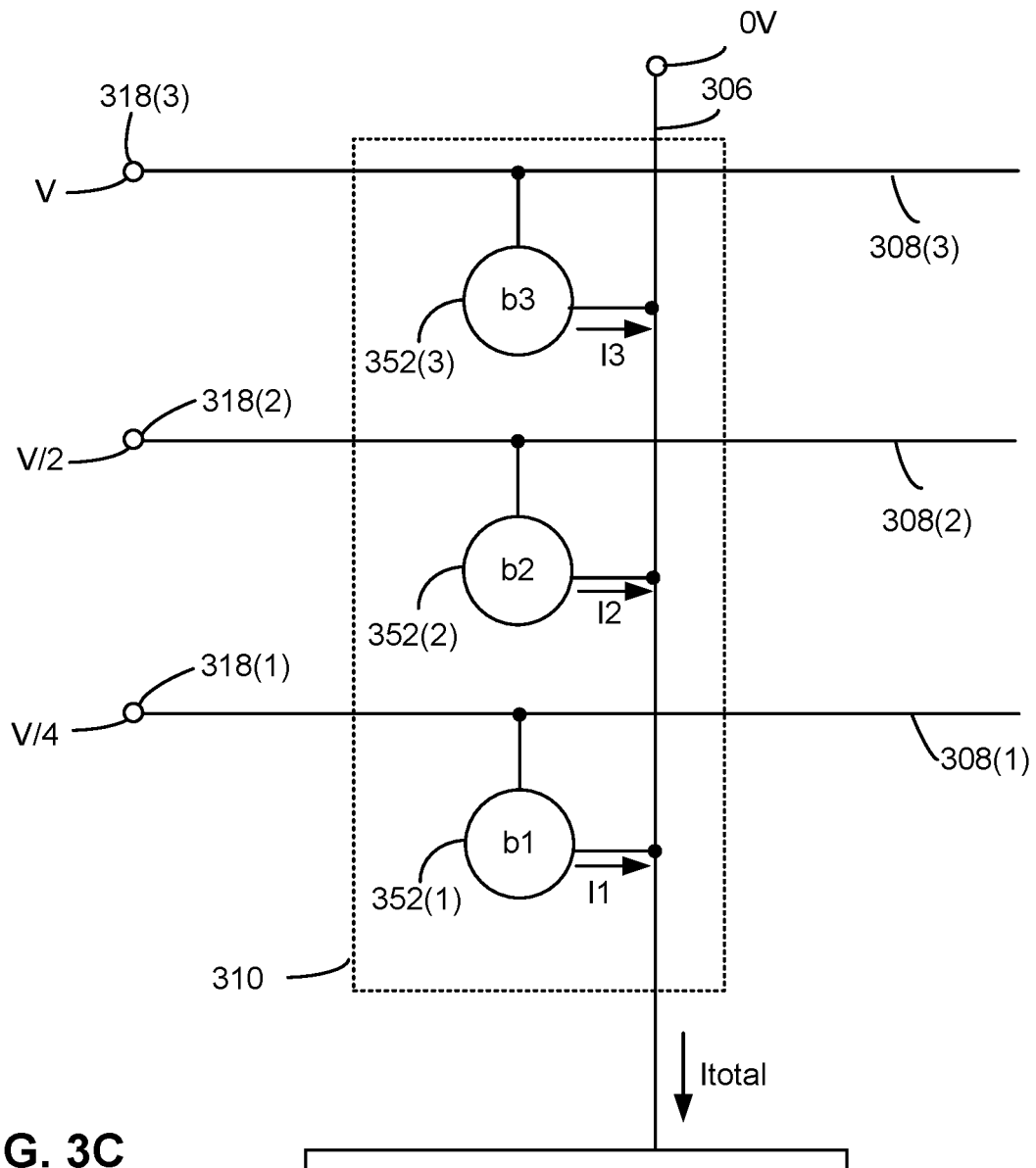
FIG. 3C is a diagram of one embodiment of an apparatus that is used to perform multiplication applying different voltages to non-volatile memory cells in a node.

FIG. 3C is a diagram of one embodiment of an apparatus 340 that is used to perform multiplication using non-volatile memory cells. Unlike the memory cells 352 in the example of FIG. 3B, the memory cells 352 in FIG. 3C are all approximately the same size. There may be some size variations due to limitations in techniques of fabricating the memory cells 352. In one embodiment, each memory cell 352 in the node 310 receives a different magnitude multiply voltage in order to represent a different bit of a multiplicand. As depicted in FIG. 3C, the voltage V is applied to first conductive line 308(3). The voltage V/2 is applied to first conductive line 308(2). The voltage V/4 is applied to first conductive line 308(1). In this example, 0V is applied to the second conductive line 306. The voltage on the second conductive line is not required to be 0V, but 0V will be used for purpose of discussion.

Thus, memory cell 352(3) receives a multiply voltage given by V−0; memory cell 352(2) receives a multiply voltage given by V/2−0; and memory cell 352(1) receives a multiply voltage given by V/4−0. Each memory cell 352 in the node 310 in the on-state passes a different magnitude current when the same magnitude multiply voltage is applied, in one embodiment. For example, assuming all memory cells 352 are in a high current state, then in response to their respective multiply voltages, memory cell 352(1) may pass a current of "x micro-amperes," memory cell 352(2) may pass a current of "2x micro-amperes," and a memory cell 352(3) may pass a current of "4x micro-amperes." In a low current state, the memory cell currents may also have a similar relationship, but the currents may be much lower. However, it is not required that the memory cell off-currents be different for each memory cell 352 in a node 310. The foregoing allows the node 310 to represent different bits of a multiplicand, in one embodiment.

The voltages on the first conductive lines 308 are not required to have the 4:2:1 ratio, shown in FIG. 3C. In another embodiment, the voltage on the second conductive line 306 is non-zero, but the ratios of the voltages across the memory cells (e.g., the multiply voltage) is 4:2:1.

Figure 3D:
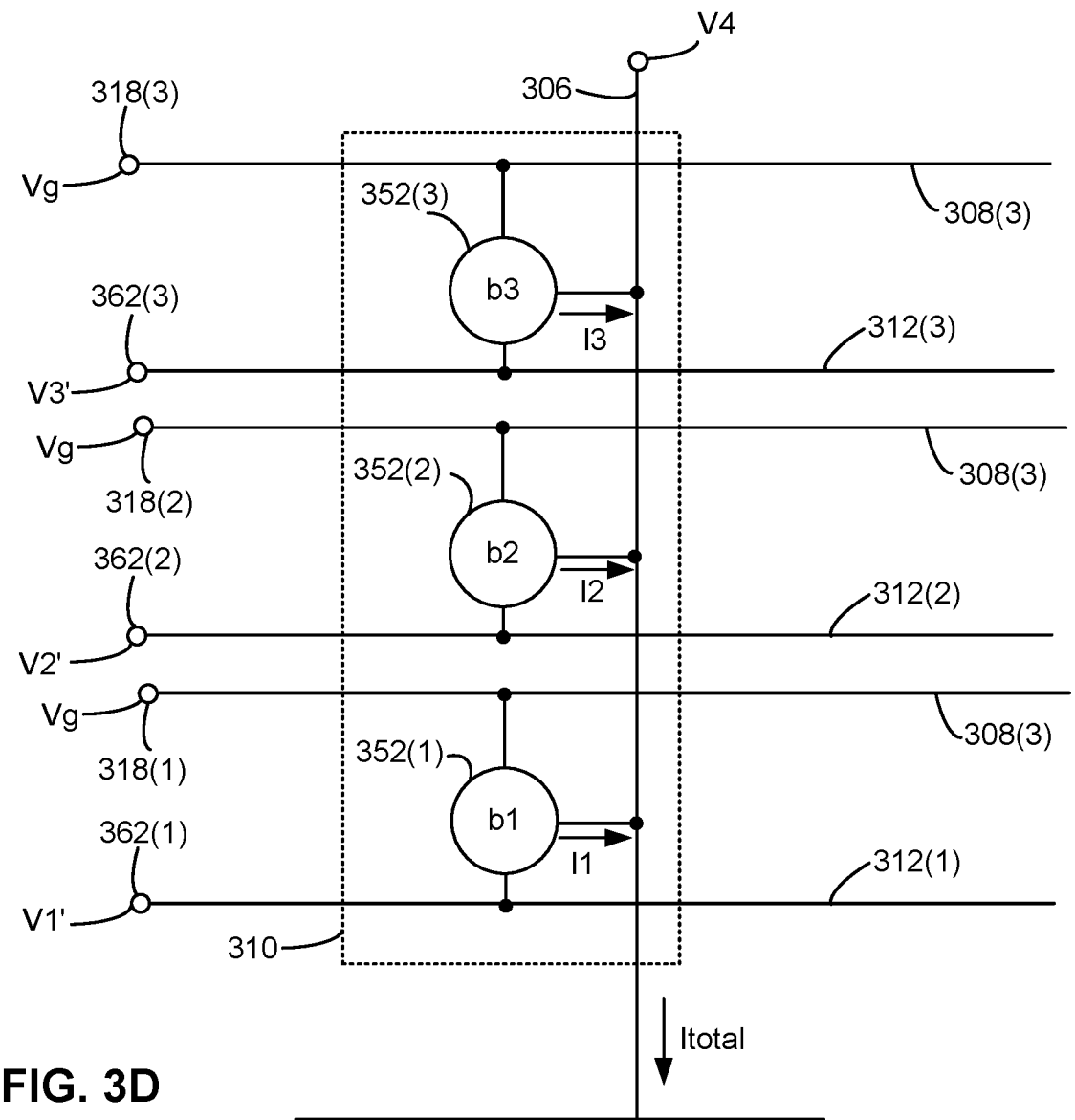
FIG. 3D is a diagram of an apparatus in which the memory cells of a node are three-terminal devices.

In some embodiments, each memory cell 352 in a node 310 is a three-terminal device. FIG. 3D is a diagram of an apparatus 360 in which the memory cells of a node are three-terminal devices. The three-terminal architecture adds a third conductive line 312 in addition to a first conductive lines 308 and second conductive line 306. In one embodiment, the third conductive lines 312 are referred to as source lines. A voltage V1' is applied to a source terminal 362(1) of the third conductive line 312(1). A voltage V2' is applied to a source terminal 362(2) of the third conductive line 312(2). A voltage V3' is applied to a source terminal 362(3) of the third conductive line 312(3). Each first conductive line 318 receives a voltage Vg, in one embodiment.

Some three-terminal memory cells have a transistor. In some embodiments, the gate terminal of the transistor is connected to a first conductive line 308. The gate terminal of the transistor is provided with a fixed voltage during one embodiment of a multiplication operation. By a "fixed voltage" it is meant that when there are more nodes in the array, each first conductive lines 308 that is selected receives the same magnitude voltage. Also, in one embodiment, the voltage on the second conductive lines 306 is a select voltage (to select memory cells connected to the second conductive line 306), which is also a fixed voltage. By this it is meant that all of the second conductive lines 306 that are selected have the same magnitude voltage applied thereto.

Thus, in one embodiment, the voltage on the third conductive line 312 is varied in order to apply the multiply voltage to a memory cell 352.

A three-terminal memory cell may respond to the multiply voltage by passing a memory cell current that has a magnitude that depends on the physical state (e.g., resistance, Vt) of the memory cell. The memory cell current may also depend on the voltage across two of the three terminals. For one type of three-terminal memory cell, the memory cell current may depend on the voltage between the first conductive line 308 and third conductive line 312. Thus, the multiply voltage is applied between the first conductive line 308 and third conductive line 312, in one embodiment. For another type of three-terminal memory cell, the memory cell current may depend on the voltage between the second conductive line 308 and the third conductive line 312. Thus, the multiply voltage is applied between the second conductive line 308 and the third conductive line 308, in one embodiment.

Figure 4A:
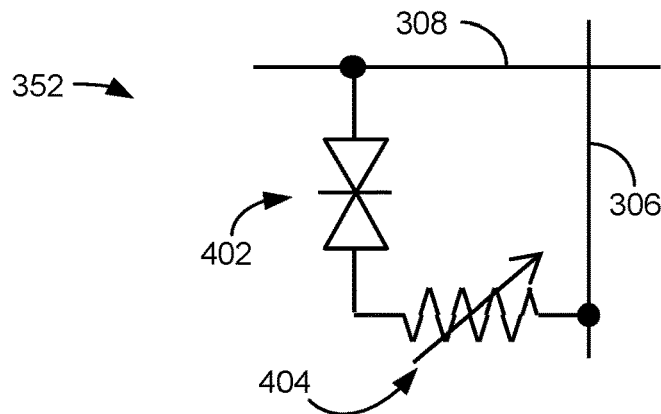
FIG. 4A shows an example two-terminal memory cell that may be used to perform multiplication.

A wide variety of non-volatile memory cells can be used in the memory nodes 310. FIG. 4A shows an example two-terminal memory cell that may be used in embodiments of FIG. 3A, 3B, or 3C. In this example, the two-terminal device has a selector 402 and an adjustable resistor 404. The adjustable resistor 404 may be any reversible resistance-switching material. The reversible resistance-switching material can be repeatedly switched between at least a first state and a second state. The first state may be a high resistance state and the second state may be a low resistance state. The high resistance state is a low current (or off) state, in one embodiment. The low resistance state is a high current (or on) state, in one embodiment. Example reversible resistance-switching material include a phase change material, a ferroelectric material, a metal oxide (e.g., hafnium oxide), a barrier modulated switching structure, or other similar reversible resistance-switching materials. The selector 402 may be a diode, which may be used to reduce leakage currents. The selector 402 is sometimes referred to as a steering element or as an isolation element.

One terminal of the two-terminal device is connected to the first conductive line 308. The other terminal is connected to the second conductive line 306. In the depicted configuration, the selector 402 is directly connected to the first conductive line 308 and the adjustable resistor 404 is directly connected to the second conductive line 306. However, in another configuration, the selector 402 is directly connected to the second conductive line 306 and the adjustable resistor 404 is directly connected to the first conductive line 308. In one embodiment, a multiply voltage is applied between first conductive line 308 and second conductive line 306 during a multiplication operation. The current in the second conductive line 306 depends on the magnitude of the multiply voltage and the resistance of the adjustable resistor 404, in one embodiment. In one embodiment, there is a linear relationship between the magnitude of the multiply voltage and the on-current of the memory cell 352. There may also be a linear relationship between the magnitude of the multiply voltage and the off-current of the memory cell 352, but this is not required.

Figure 4B:
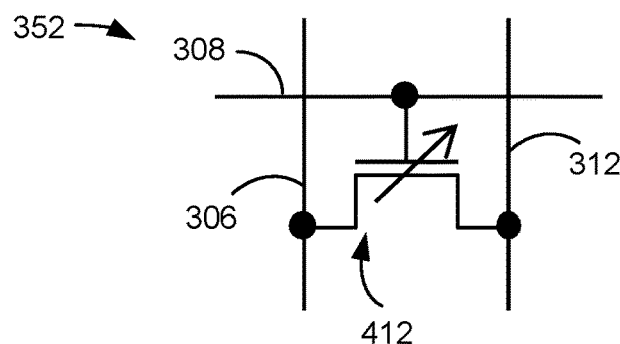
FIGS. 4B and 4C show two example three-terminal memory cells that may be used to perform multiplication.
Figure 4C:
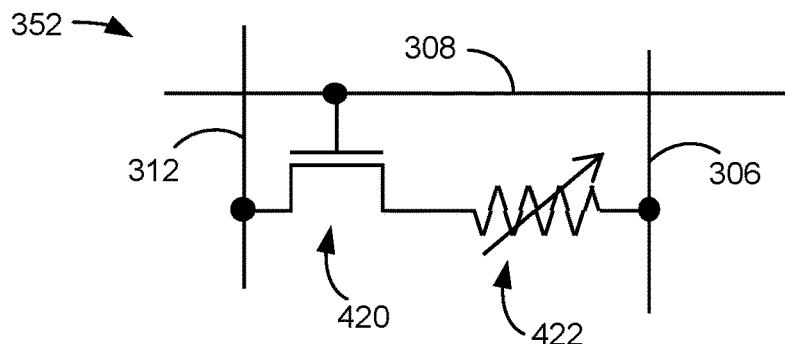

In some embodiments, the memory cells 352 in a node 310 are three-terminal memory cells. FIGS. 4B and 4C show two example three-terminal memory cells 352. FIG. 4B depicts a three-terminal device having an adjustable threshold voltage (Vt) transistor 412 that has an adjustable threshold voltage. In one embodiment, the adjustable Vt transistor 412 has a low Vt state and a high Vt state. The high Vt state is a low current (or off) state, in one embodiment. The low Vt state is a high current (or on) state, in one embodiment. The adjustable Vt transistor 412 can be repeatedly switched between the low threshold voltage state and the high threshold voltage state. The adjustable Vt transistor 412 may be a ferroelectric field effect transistor (FeFET).

A first terminal (transistor gate) of the adjustable Vt transistor 412 is connected to the first conductive line 308. A second terminal of the adjustable Vt transistor 412 is connected to the second conductive line 306. The third terminal of the adjustable Vt transistor 412 is connected to the third conductive line 312. In one embodiment, the first conductive line 308 passes a fixed voltage to the gate of the transistor 412 during the multiplication operation. In one embodiment, the voltage to the gate of the adjustable Vt transistor 412 is tuned such that the adjustable Vt transistor 412 operates in the linear regime. If the gate voltage is greater than the sum of the maximum voltage on the third conductive line 312 and the maximum Vt of the adjustable Vt transistor 412, then the adjustable Vt transistor 412 operates in the linear regime, in one embodiment.

In one embodiment, a multiply voltage is applied between the first conductive line 308 and third conductive line 312 during a multiplication operation. The current in the second conductive line 306 depends on the magnitude of the multiply voltage and the Vt of the adjustable Vt transistor 412, in one embodiment. In one embodiment, there is a linear relationship between the magnitude of the multiply voltage and the on-current of the Vt transistor 412. There may also be a linear relationship between the magnitude of the multiply voltage and the off-current of the Vt transistor 412, but this is not required.

FIG. 4C depicts an example three-terminal device, which may be used as a memory cell 352. In this example, the three-terminal device has an access transistor 420 and an adjustable resistor 422. The adjustable resistor 422 may be any reversible resistance-switching material. The reversible resistance-switching material can be repeatedly switched between at least a first state and a second state. The first state may be a high resistance state and the second state may be a low resistance state. The high resistance state is a low current (or off) state, in one embodiment. The low resistance state is a high current (or on) state, in one embodiment. Example reversible resistance-switching materials include a phase change material, a ferroelectric material, a metal oxide (e.g., hafnium oxide), a barrier modulated switching structure, or other similar reversible resistance-switching materials. Access transistor 420 is a field effect transistor (FET), in one embodiment. Access transistor 420 is a bipolar junction transistor (BJT), in one embodiment.

A first (transistor gate) terminal of the memory cell 352 in FIG. 4C is connected to the first conductive line 308. A second terminal is connected to the second conductive line 306. The third terminal of the memory cell 352 is connected to the third conductive line 312. In one embodiment, the first conductive line 308 provides a fixed voltage to the gate of the access transistor 420 during the multiplication operation. In one embodiment, a multiply voltage is applied between second conductive line 306 and third conductive line 312 during a multiplication operation. The current in the second conductive line 306 depends on the magnitude of the multiply voltage and the resistance of the adjustable resistor 422, in one embodiment. In one embodiment, there is a linear relationship between the magnitude of the multiply voltage and the on-current of the memory cell 352. There may also be a linear relationship between the magnitude of the multiply voltage and the off-current of the memory cell 352, but this is not required.

Figure 5A:
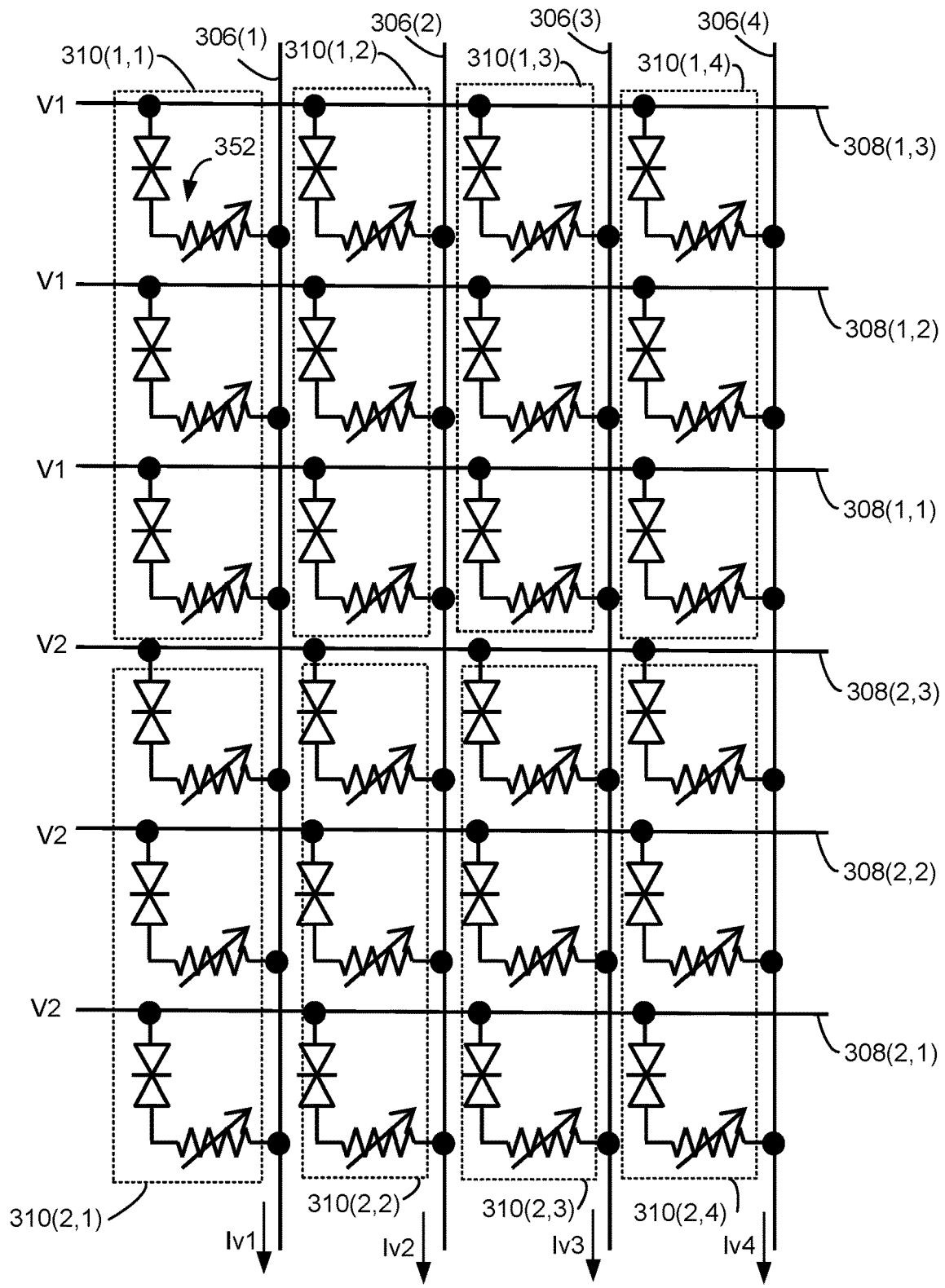
FIG. 5A is a diagram of one embodiment of a cross-point array that may be used to performed multiply and accumulate (MAC) using two-terminal memory cells.

FIG. 5A is a diagram of one embodiment of a cross-point array 500 that may be used to performed MAC. There are eight nodes 310 of memory cells 352 in FIG. 5. Each node 310 is consistent with the node 310 in FIG. 3B. FIG. 5A shows two data rows and six physical rows of memory cells. Four of the nodes 310(1,1), 310(1,2), 310(1,3), and 310(1,4) reside in one data row. Four of the nodes 310(2,1), 310(2,2), 310(2,3), and 310(2,4) reside in another data row. Each node in a data row receives the same multiplier during a multiply operation, in one embodiment. However, the data row is divided into multiple physical rows of memory cells. In this example, there are three physical rows of memory cells per data row.

The memory cells 352 are two terminal devices and are consistent with the example of FIG. 4A, in this example. Each memory cell 352 in a node 310 has a different size in order for each memory cell to be able to represent a different bit of a multiplicand, in one embodiment. For example, the adjustable resistor 404 in each memory cell in a node has a different size. The adjustable resistor 404 has a substantially circular cross-section in one embodiment. In this case, the diameter of the adjustable resistor 404 in each memory cell in a node is different, in one embodiment.

In one embodiment, the relationship of the cross-sectional areas of the adjustable resistor 404 is "A", "2A", and "4A". This refers to a cross-section perpendicular to a direction of current flow in the adjustable resistor 404. Such a relationship results in an on-current relationship (for the same multiply voltage to each cell) of "I", "2I", and "4I". This relationship allows the memory cells to represent the "1s" position, the "2s" position, and the "4s" position, of a binary number system, in one embodiment. Note that conductance of the memory cells (when in the on-state) may exhibit the same relationship. If there are more than three memory cells each node 310, the cross-sectional areas may increase by a factor of two with each added memory cell.

The size relationships between adjustable resistor 404 of the memory cells in a node 310 may be expressed in terms of diameter, in some embodiments. As one example, the non-volatile memory cells 352 in the node 310 may be ordered from a least significant bit to a most significant bit. The diameter of the adjustable resistor 404 in a memory cell 352 is greater by a factor of the square root of two relative to the adjustable resistor 404 in a previous memory cell going from the least significant bit to the most significant bit, in one embodiment. When expressed in terms of cross-sectional areas, the cross-sectional area of the adjustable resistor 404 in a memory cell 352 is greater by a factor of two relative to the adjustable resistor 404 in a previous memory cell going from the least significant bit to the most significant bit, in one embodiment.

The nodes 310 are arranged as rows and columns. Each column of nodes 310 is connected to the same second conductive line 306. Nodes 310(1,1) and 310(2,1) are connected to second conductive line 306(1). This allows the nodes 310(1,1) and 310(2,1) to be used in a MAC (or vector multiply operation). In this example, each vector has two elements. One element of the vector may be stored in node 310(1,1), with the other element of the vector stored in node 310(2,1). The vector that is stored in the nodes 310(1,1) and 310(2,1) could represent weights in a neural network. For the sake of discussion, this vector will be referred to as a first weight vector. However, the vector is not required to be weights in a neural network.

The other vector is represented by the voltages V1, V2 (assuming the voltages on the second conductive line 306(1) is zero). For the sake of discussion this vector will be referred to as an "input vector." The input vector represents input neurons 202 of a neural network, in one embodiment. The second conductive lines 306 receive a select voltage, during one embodiment of a multiply operation. In one embodiment, each of the second conductive lines 306 receives the same voltage. More generally, the first element of the vector is represented by the difference between V1 and the voltage on the second conductive lines 306, in one embodiment. More generally, the second element of the vector is represented by the difference between V2 and the voltage on the second conductive lines 306, in one embodiment.

Voltages V1 and V2 are simultaneously applied to the first conductive lines 308 (as shown in FIG. 5A), while a select voltage is applied to the second conductive line 306(1), in one embodiment. This results in memory cell currents in the memory cells in nodes 310(1,1) and 310(1,2) as has been discussed with respect to FIG. 3B. Thus, the current from the memory cells in node 310(1,1) represents a multiplication of the multiply voltage applied to memory cells in node 310(1,1) by the multiplicand stored in node 310(1,1). The current from the memory cells in node 310(2,1) represents a multiplication of the multiply voltage applied to cells in node 310(2,1) by the multiplicand stored in node 310(2,1). The current from node 310(1,1) and node 310(1,2) combine to form a MAC operation. Stated another way, the current (Iv1) in second conductive line 306(1) represents a vector dot product of the first weight vector and the input vector.

Three other MAC operations (or vector/vector multiplies) may be performed at the same time using the other nodes. Nodes 310(1,2) and 310(2,2) are connected to second conductive line 306(2). This allows the nodes 310(1,2) and 310(2,2) to be used in a MAC (or vector multiply operation). One element of a second weight vector may be stored in node 310(1,2), with the other element of the second weight vector stored in node 310(2,2). The current Iv2 in second conductive line 306(2) represents a vector dot product of the input vector and the second weight vector.

Nodes 310(1,3) and 310(2,3) are connected to second conductive line 306(3). This allows the nodes 310(1,3) and 310(2,3) to be used in a MAC (or vector multiply operation). One element of a third weight vector may be stored in node 310(1,3), with the other element of the third weight vector stored in node 310(2,3). The current Iv3 in second conductive line 306(3) represents a vector dot product of the input vector and the third weight vector.

Nodes 310(1,4) and 310(2,4) are connected to second conductive line 306(4). This allows the nodes 310(1,4) and 310(2,4) to be used in a MAC (or vector multiply operation). One element of a fourth weight vector may be stored in node 310(1,4), with the other element of the fourth weight vector stored in node 310(2,4). The current Iv4 in second conductive line 306(4) represents a vector dot product of the input vector and the fourth weight vector.

The currents Iv1, Iv2, Iv3, and Iv4 may be referred to as vector currents. Although the sense circuit 150 is not depicted in FIG. 5A, the sense circuit 150 may be used to sense currents Iv1, Iv2, Iv3, and Iv4. In one embodiment, the sense circuit 150 performs an analog to digital conversion of currents Iv1, Iv2, Iv3, and Iv4 in order to produce a vector that represents vector/matrix multiplication. The vector in the "vector/matrix" multiply is a vector whose elements are the multipliers. The matrix is the multiplicands stored in the nodes. However, it is not required to convert the analog currents to digital values. Another possibility is to compare each of the currents Iv1, Iv2, Iv3, and Iv4 to a reference current, and generate a result for each comparison.

Figure 5B:
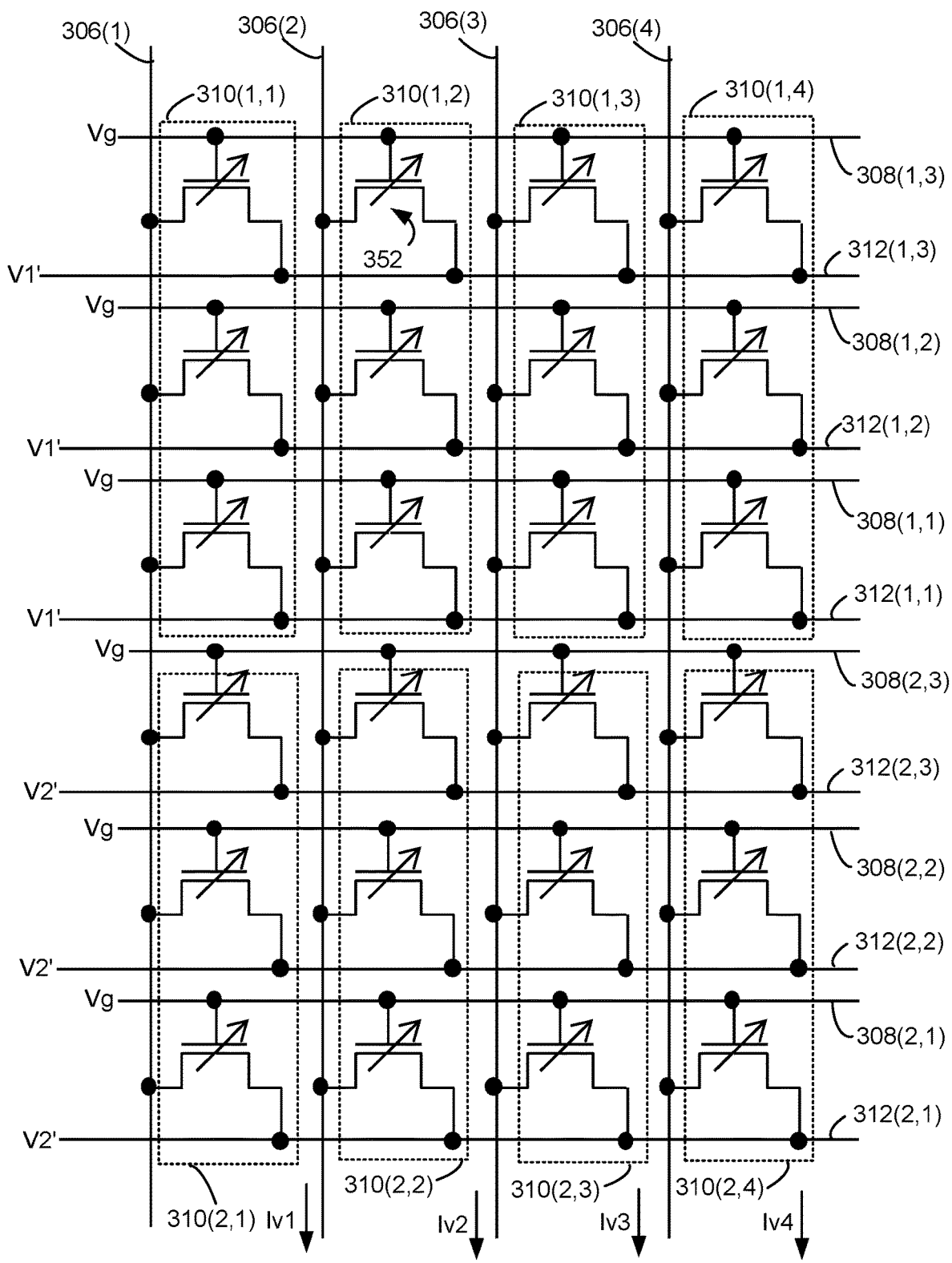
FIG. 5B shows one embodiment of apparatus having a cross-point array that may be used to perform vector/vector multiplication using three-terminal memory cells.

FIG. 5B shows one embodiment of an apparatus having a cross-point array 550 that may be used to perform vector/vector multiplication, similar to the array 500 of FIG. 5A. However, the memory cells 352 in FIG. 5B are three-terminal memory cells. Each memory cell has an adjustable Vt transistor 412. FIG. 4B depicts a three-terminal memory cell with an adjustable Vt transistor 412 that may be used in the array 550 of FIG. 5B.

Each memory cell 352 in a node 310 has a different size in order for each memory cell to be able to represent a different bit of a multiplicand, in one embodiment. For example, the adjustable Vt transistor 412 in each memory cell in a node has a different size (e.g., W/L). In one embodiment, the relationship of the W/L of the adjustable Vt transistor 412 is "W/L", "2 W/L", and "4 W/L". Such a relationship results in an on-current relationship (for the same multiply voltage to each cell) of "I", "2I", and "4I". This relationship allows the memory cells to represent the "1s" position, the "2s" position, and the "4s" position, of a binary number system, in one embodiment. If there are more than three memory cells each node 310, the W/L may increase by a factor of two with each added memory cell.

As one example, the non-volatile memory cells 352 in the node 310 may be ordered from a least significant bit to a most significant bit. The W/L of the adjustable Vt transistor 412 in a memory cell 352 is greater by a factor of the two relative to the adjustable Vt transistor 412 in a previous memory cell going from the least significant bit to the most significant bit, in one embodiment.

The architecture of FIG. 5B adds third conductive lines 312 relative to the architecture of FIG. 5B. The third conductive lines 312 may be referred to as source lines. There are six rows of memory cells in FIG. 5B, third conductive line 312(1,3) is connected to the top row, third conductive line 312(1,2) is connected to the next row, a and, third conductive line 312(1,1) is connected to the next row. Each memory cell in each of these three rows is used to store a different bit of a multiplicand, in one embodiment. For example, memory cells in the row connected to third conductive line 312(1,3) may be used to store the "4s" position, memory cells in the row connected to third conductive line 312(1,2) may be used to store the "2s" position, and memory cells in the row connected to third conductive line 312(1,1) may be used to store the "1s" position.

A voltage V1' is applied to three of the third conductive lines 312(1,3), 312(1,2), 312(1,1). A voltage V2' is applied to three of the third conductive lines 312(2,3), 312(2,2), 312(2,1). Moreover, these voltages may be applied to the third conductive lines 312 simultaneously. A voltage Vg is applied to each of the first conductive lines 308. In one embodiment, a multiply voltage is defined as the difference between the voltage on the first conductive line 308 and third conductive line 312 connected to a memory cell. A bit line select voltage may be applied to each of the second conductive lines 306. These applied voltages result in current Iv1 in second conductive line 306(1), current Iv2 in second conductive line 306(2), current Iv3 in second conductive line 306(3), and current Iv4 in second conductive line 306(4). Each of these currents represents a vector dot product of a weight vector stored in one of the columns of nodes and an input vector, in one embodiment.

Figure 6A:
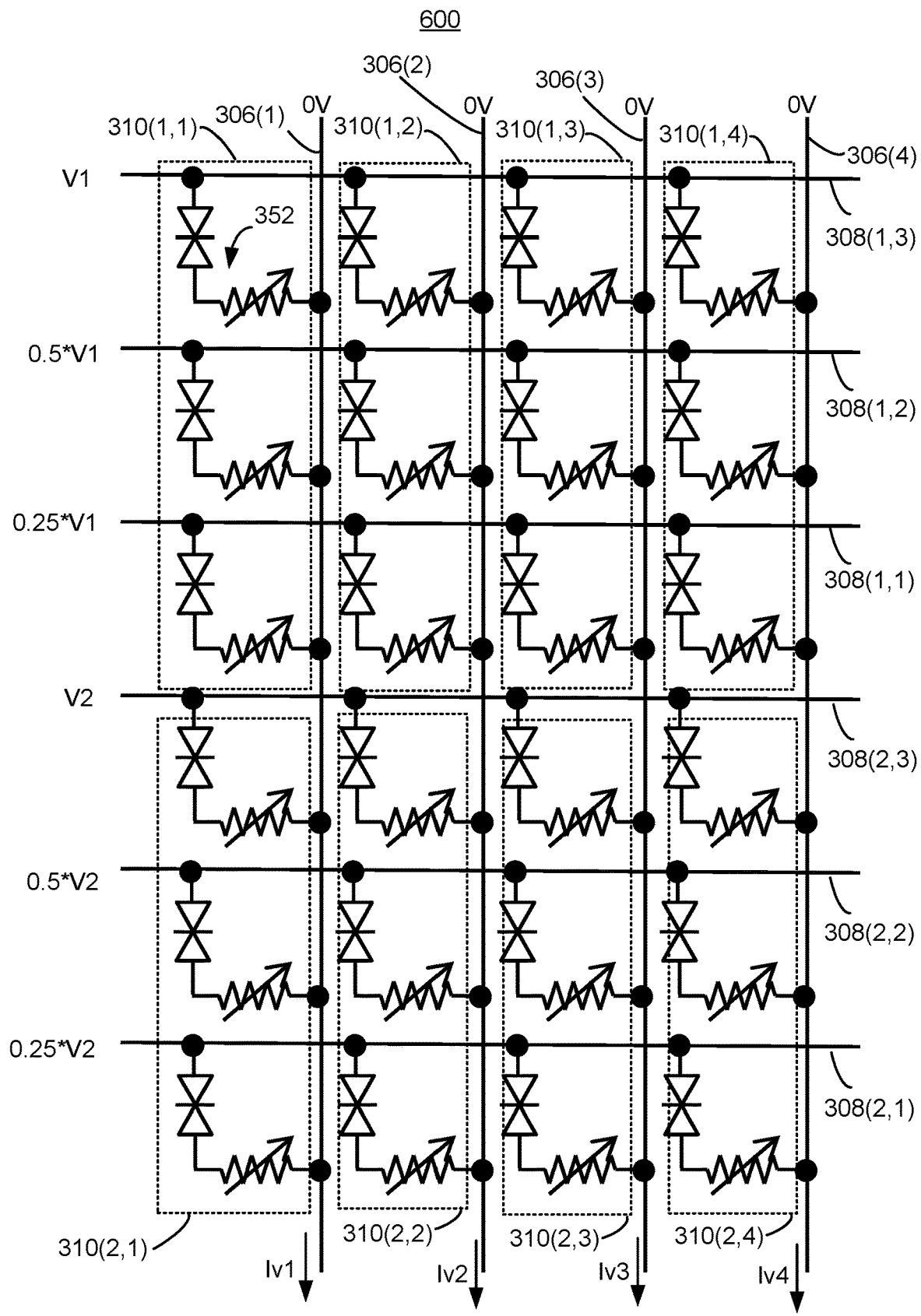
FIG. 6A is a diagram of one embodiment of a memory array that may be used to perform MAC by applying different voltages to two-terminal memory cells in a node.

FIG. 6A is a diagram of one embodiment of a memory array 600 that may be used to perform MAC. The nodes 310 in array 600 are consistent with the node in FIG. 3C. The memory cells 352 in FIG. 6A are consistent with the memory cell of FIG. 4A, but other types of two terminal memory cells may also be used.

The voltage V1 is applied to first conductive line 308(1,3). The voltage 0.5*V1 is applied to first conductive line 308(1,2). The voltage 0.25*V1 is applied to first conductive line 308(1,1). The voltage V2 is applied to first conductive line 308(2,3). The voltage 0.5*V2 is applied to first conductive line conductive line 308(2,2). The voltage 0.25*V2 is applied to first conductive line 308(2,1). The voltage on each of the second conductive 306 lines is 0V, in this example. As discussed above with respect to FIG. 3C, the voltage on the second conductive line 306 is not required to be 0V. However, if a non-zero voltage is used on the second conductive lines 306, the voltage across the three memory cells in a node 310 has a 4:2:1 ratio, in one embodiment.

Each node 310 may be used to perform multiplication of a multiplicand stored in the node 310 and a multiplier represented by a multiply voltage, as discussed with respect to the node of FIG. 3C. However, similar to the discussion of FIG. 5A, MAC operations may be performed using a column of nodes 310. Also, vector/matrix multiplication can be performed using an array of nodes 310.

Figure 6B:
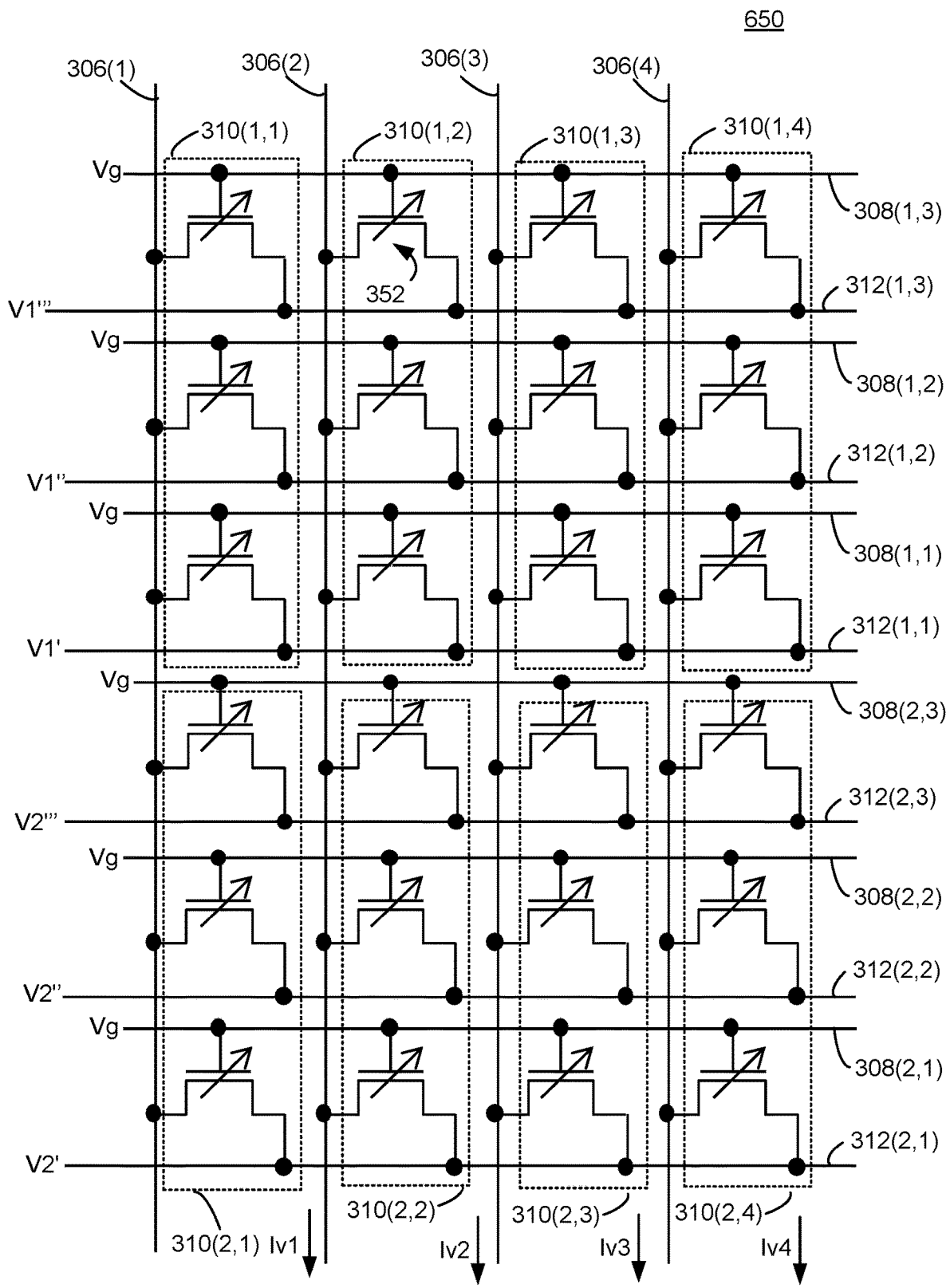
FIG. 6B is a diagram of one embodiment of a memory array that may be used to perform MAC by applying different voltages to three-terminal memory cells in a node.

FIG. 6B is a diagram of one embodiment of a memory array 650 that may be used to perform MAC. The nodes 310 in array 650 are consistent with the node in FIG. 3C. The memory cells 352 in FIG. 6B are consistent with the memory cell of FIG. 4B, but other types of three terminal memory cells may also be used.

The voltage V1' is applied to first conductive line 308(1,3). The voltage V1" is applied to first conductive line 308(1,2). The voltage V1'" is applied to first conductive line 308(1,1). The voltage V2' is applied to first conductive line 308(2,3). The voltage V2" is applied to first conductive line 308(2,2). The voltage V2'" is applied to first conductive line 308(2,1). The voltage Vg is applied to each of the third conductive lines 312.

Each memory cell 352 may pass a current that is based on the voltage between the gate and source of the adjustable Vt transistor. Thus, each memory cell 352 may pass a current based on the voltage between the first conductive line 308 and the third conductive line 312 to which that memory cell is connected. This voltage may be referred to herein as a "multiply voltage". The ratio of the multiply voltages in each node 310 is 4:2:1, in one embodiment. Thus, depending on the magnitude of Vg, the magnitudes of V1', V1" and V1'" may easily be determined to achieve such a ratio. Likewise, the magnitudes of V2', V2" and V2'" may easily be determined to achieve such a ratio.

Each node 310 may be used to perform multiplication of a multiplicand stored in the node 310 and a multiplier represented by a multiply voltage, as discussed with respect to the node of FIG. 3C. However, similar to the discussion of FIG. 5B, MAC operations may be performed using a column of nodes 310. Also, vector/matrix multiplication can be performed using an array of nodes 310.

As was discussed in connection with FIG. 5A, the sense circuit 150 may be used to sense currents Iv1, Iv2, Iv3, and Iv4 in FIGS. 5B, 6A, and/or 6B. Thus, for FIGS. 5B, 6A, and/or 6B, the sense circuit 150 may perform an analog to digital conversion of currents Iv1, Iv2, Iv3, and Iv4 in order to produce a vector that represents vector/matrix multiplication. However, it is not required to convert the analog currents to digital values. Another possibility is to compare the each of the currents Iv1, Iv2, Iv3, and Iv4 to a reference current, and generate a result for each comparison.

Figure 7:
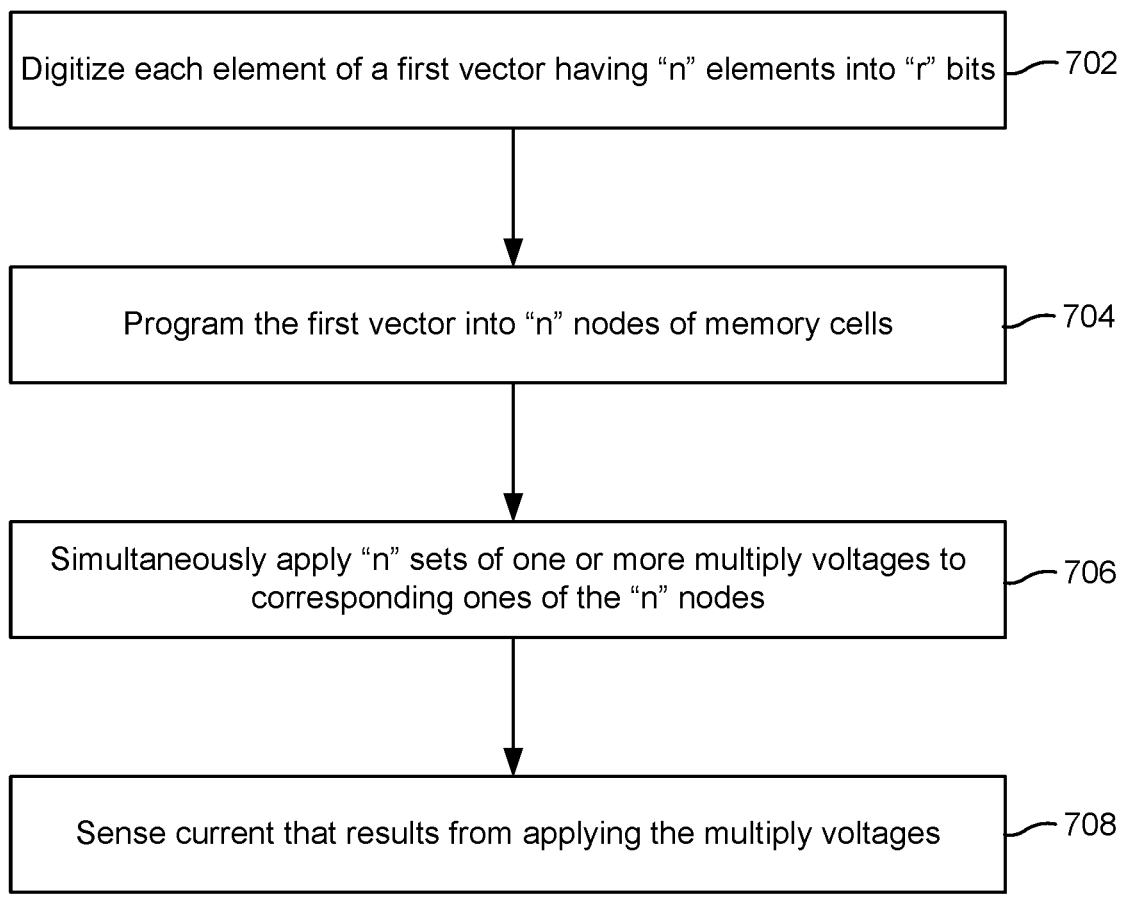
FIG. 7 is a flowchart of one embodiment of a process of multiplying two vectors using non-volatile memory cells.

FIG. 7 is a flowchart of one embodiment of a process 700 of multiplying two vectors using non-volatile memory cells. Process 700 may be performed in any of the arrays in FIG. 5A, 5B, 6A, or 6B, but is not limited to those arrays. Process 700 describes using one column of "n" nodes 310, such that vector/vector multiply is performed. The process can performed in parallel on "m" columns of nodes 310 to perform vector/matrix multiplication (for an "n×m" matrix). Process 700 could use any of the memory cells in FIG. 4A, 4B, or 4C, but is not limited to those memory cells.

Step 702 includes digitizing each element of a first vector having "n" elements into "r" bits. This first vector represents weights in an artificial neural network 200, in one embodiment. The first vector might initially be represented by any type of information, such as "n" analog signals or "n" digital signals. If the first vector is initially represented by analog signals, then step 702 may include converting the analog signal to digital signals.

Step 704 includes programming the first vector into a corresponding "n" nodes 310 of non-volatile memory cells 352. Each node 310 is electrically connected to the same second conductive line 306, in one embodiment. By a node 310 being electrically connected to a second conductive line 306 it is meant that each memory cell in the node has a terminal connected to the same second conductive line. In one embodiment, each node 310 is electrically connected to "r" different first conductive lines 308. By this it is mean that each memory cell in the node has a terminal connected to a different first conductive line 308. In one embodiment, each node 310 is electrically connected to "r" different first conductive lines 308 and also to "r" different third conductive lines 312. By this it is mean that each memory cell in the node has a terminal connected to a different first conductive line 308 and also has another terminal connected a different third conductive line 312.

Each memory cell 352 is programmed to one of two states, in one embodiment. In one embodiment, the two states are a low resistance (or high conductance) state and a high resistance (or low conductance) state. In one embodiment, the two states are a low Vt state and a high Vt state. The two states are a high current (or on) state, and a low current (or off) state, in one embodiment.

Step 706 includes simultaneously applying "n" sets of one or more multiply voltages to a corresponding "n" nodes 310 of memory cells. Step 706 may include applying a multiply voltage between two terminals of each memory cell 352. With respect to the memory cells 352 in FIG. 5A, each multiply voltage might be applied between one of the first conductive lines 308 and one of the second conductive lines 308. With respect to the memory cells 352 in FIG. 5B, each multiply voltage might be applied between one of the first conductive lines 308 and one of the third conductive lines 312. For both FIGS. 5A and 5B, there may be a single multiply voltage in each of the "n" sets. This is because each memory cell 352 in a node 310 receives the same magnitude multiply voltage in the arrays in FIGS. 5A and 5B.

With respect to the memory cells 352 in FIG. 6A, each multiply voltage might be applied between one of the first conductive lines 308 and one of the second conductive lines 306. With respect to the memory cells 352 in FIG. 6B, each multiply voltage might be applied between one of the first conductive lines 308 and one of the third conductive lines 312. For both FIGS. 6A and 6B, there is more than one multiply voltage in each of the "n" sets. This is because each memory cell 352 in a node 310 receives a different magnitude multiply voltage in the arrays in FIGS. 6A and 6B. However, each multiply voltage applied to a node 310 represents the same multiplier, in one embodiment.

Step 708 includes sensing a total current that results in the second conductive line from applying the multiply voltages. The magnitude of the current represents a vector dot product of the first vector and the second vector. In one embodiment, the magnitude of the total current in the second conductive line is compared with the magnitude of a reference current. This comparison may be performed by a sense amplifier. The sense amplifier may output a result of whether the magnitude of the total current as greater or less than the magnitude of the reference current. In one embodiment, the magnitude of the total current is converted from an analog current to a digital value (e.g., a number of bits).

Figure 8:
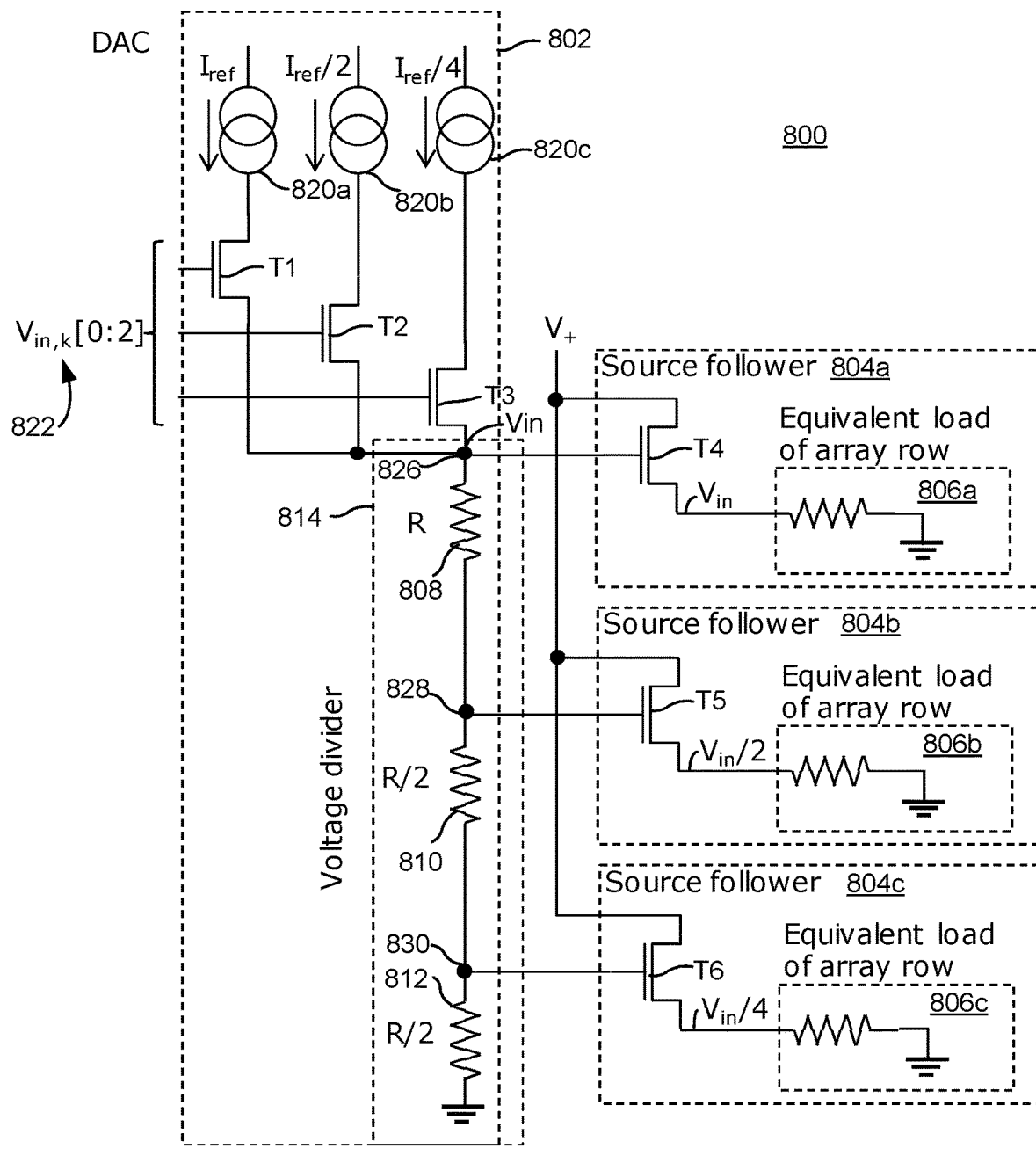
FIG. 8 is a diagram of one embodiment of a circuit that may be used to provide voltages during a multiply operation using non-volatile memory cells.

FIG. 8 is a diagram of one embodiment of a circuit 800 that may be used to provide voltages during a multiply operation. The circuit 800 may be used to provide the voltages V, V/2 and V/4 in FIG. 3C. The circuit 800 may be used to provide the voltages V1, 0.5*V1 and 0.25*V1 in FIG. 6A. The circuit 800 may be used to provide the voltages V2, 0.5*V2 and 0.25*V2 in FIG. 6A. The circuit 800 has a digital to analog converter (DAC) 802. Three source followers 804a, 804, and 804c are connected to the DAC 802.

The DAC 802 has three reference current sources 820a, 820b, and 820c. Reference current source 820a provides a reference current Iref to transistor T1. Reference current source 820b provides a reference current Iref/2 to transistor T2. Reference current source 820c provides a reference current Iref/4 to transistor T3. The gate of each of these three transistors T1, T2, T3 is driven by one "bit" of an input signal 822. The input signal 822 is a digital signal with three bits [0:2] in this example. The input signal 822 represents one element of an input vector, in one embodiment.

Each of the three transistors T1, T2, T3 is connected to a voltage divider 814, which has resistor 808, resistor 810, and resistor 812. Resistor 808 has a resistance of "R Ohms." Resistor 810 has a resistance of "R/2 Ohms." Resistor 812 has a resistance of "R/2 Ohms." Depending on the value of the bit provided to the gate of transistors T1, T2, T3, the transistor will either pass its reference current to the voltage divider 814 or not pass its reference current to the voltage divider 814. For example, if the bit has a value of "1", then the transistor will pass its reference current to the voltage divider 814.

The magnitude of the voltage at the top terminal 826 of resistor 808 is an analog version of the input digital signal 822. The magnitude of the voltage is "Vin." The magnitude of the voltage at the top terminal 828 of resistor 810 is one half the terminal of the voltage at the top terminal 826 of resistor 808. The magnitude of the voltage at the top terminal 830 of resistor 812 is one half the terminal of the voltage at the top terminal 828 of resistor 810.

The gate of transistor T4 in source follower 804a is connected to the top terminal 826 of resistor 808, wherein the voltage Vin appears at the source of transistor T4. The voltage Vin may thus be provided to one of the rows 806a in the array.

The gate of transistor T5 in source follower 804b is connected to the top terminal 828 of resistor 810, wherein the voltage Vin/2 appears at the source of transistor T5. The voltage Vin/2 may thus be provided to one of the rows 806b in the array.

The gate of transistor T6 in source follower 804c is connected to the top terminal 830 of resistor 812, wherein the voltage Vin/4 appears at the source of transistor T6. The voltage Vin/4 may thus be provided to one of the rows 806c in the array.

Figure 9:
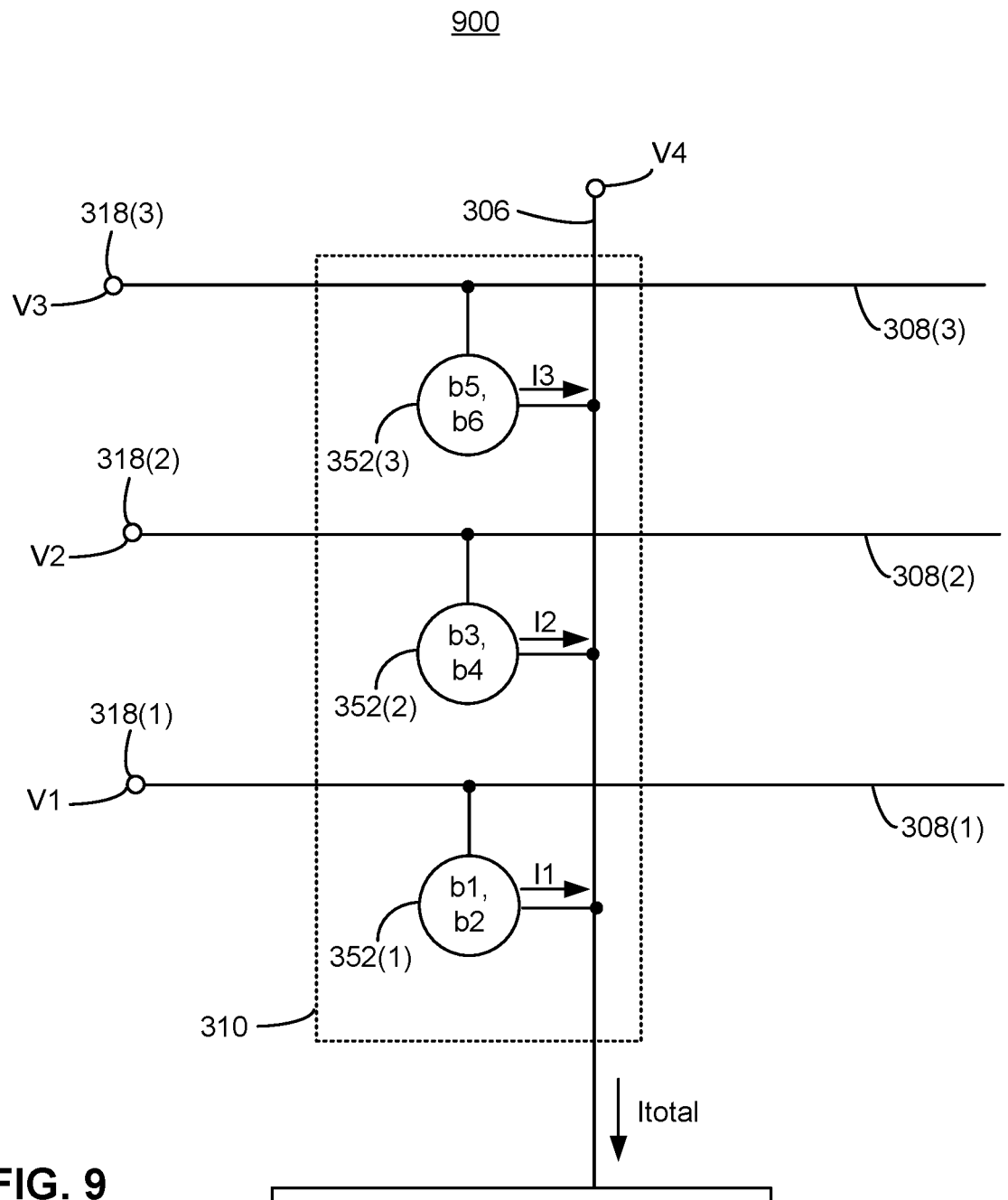
FIG. 9 depicts one embodiment of an array in which the memory cells each store two bits of a multiplicand.

Numerous examples have been provided herein in which the memory cells 352 in a node 310 are programmed to one of two physical states. In some embodiments, the memory cells 352 in a node 310 are programmed to one of four or more physical states. Hence, each memory cell 352 may store two or more bits of a multiplicand, in some embodiments. FIG. 9 depicts one embodiment of an array 900 in which the memory cells 352 each store two bits of a multiplicand. In this example, the multiplicand has a resolution of six bits. Bits 1 and 2 are stored in memory cell 352(1), bits 3 and 4 are stored in memory cell 352(2), and bits 5 and 6 are stored in memory cell 352(3).

Each memory cell 352 in FIG. 9 may be programmed to one of four different physical states (e.g., resistance, Vt). In one embodiment, each memory cell 352 has an adjustable resistor, and the four different states are four different resistances (or alternatively conductances). In one embodiment, each memory cell 352 has a transistor with an adjustable threshold voltage, and the four different states are four different transistor threshold voltages. For ease of discussion these four states will be referred to as "00," "01," "10," and "11." Each physical state is associated with a memory cell current. For the sake of discussion these currents will be referred to as $I_{00}$, $I_{01}$, $I_{10}$, and $I_{11}$. The magnitudes of the currents increase in the sequence $I_{00}$, $I_{01}$, $I_{10}$, $I_{11}$, in one embodiment. In one embodiment, there is a linear relationship between the magnitudes of these four currents.

Operation of the array 900 of FIG. 9 may be similar to the array of FIG. 3A. In one embodiment of the array 900 of FIG. 9, the magnitude of each multiply voltage is selected such that each memory cell current represents a product of a multiplier and the bits of the multiplicand stored in that memory cell. For example, consider the example in which all memory cells 352(1), 352(2), 352(3) are in the 11" state (which corresponds to the $I_{11}$ current. In this example, each memory cell stores a "11" in its position of the multiplicand. In this case, memory cell 352(1) may pass a current of "x micro-amperes," in response to the multiply voltage applied to memory cell 352(1); memory cell 352(2) may pass a current of "4x micro-amperes," in response to the multiply voltage applied to memory cell 352(2); and memory cell 352(3) may pass a current of "16x micro-amperes, in response to the multiply voltage applied to memory cell 352(3)." The effect is that each memory cell current represents a product of the same multiplier and the two bits of the multiplicand stored in that memory cell. In general, increasing the magnitude of the multiply voltages increases the memory cell currents. In one embodiment, the memory cell current (for at least the 01, 10, and 11 states) has a linear relationship with the multiply voltage. Hence, the magnitudes of the multiply voltages may be adjusted in order to represent different multipliers. In the $I_{00}$ current state, the memory cell currents may also have a similar relationship (e.g., 16:4:1 relationship), but the currents may be much lower. The foregoing allows the node 310 having three memory cells to represent six different bits of a multiplicand, in one embodiment.

The resolution can be increased by adding more memory cells 352 to the node 310. Also, each memory cell could store three or more bits. The various arrays depicted in FIGS. 3B, 3C, 3D, 5A, 5B, 6A, and 6B may also be used to store two or more bits per memory cell 352.

A first embodiment disclosed herein includes an apparatus comprising a node of memory cells, a bit line associated with the node of memory cells, a write circuit, multiply circuit, and a sense circuit. The write circuit is configured to store a multiplicand in the node of memory cells. The write circuit is configured to store a different set of one or more bits of the multiplicand in each memory cell of the node. The multiply circuit is configured to simultaneously apply a multiply voltage to each memory cell in the node. Each memory cell is configured to pass a memory cell current to the bit line that represents a product of a multiplier and the set of one or more bits of the multiplicand stored in the memory cell. The multiplier is represented by a magnitude of the multiply voltage applied to each respective memory cell. The sense circuit is configured to sense a magnitude of a total current in the bit line that results from the multiply circuit simultaneously applying a multiply voltage to each memory cell in the node. The magnitude of the total bit line current represents a product of the multiplier and the multiplicand.

In a second embodiment, in furtherance of the first embodiment, the apparatus the memory cells reside in a cross-point array having rows of memory cells and columns of memory cells. Each memory cell in the node is in a different row of the cross-point array.

In a third embodiment, in furtherance of the first or second embodiments, the node of memory cells comprises "r" memory cells. The write circuit is further configured to digitize the multiplicand into "r" bits. The write circuit is further configured to store one of the "r" bits into each of the "r" memory cells in the node.

In a fourth embodiment, in furtherance of any of the first to third embodiments, each non-volatile memory cell in the node has an on-current having a magnitude and an off-current. The magnitudes of the on-currents of the memory cells in the node differ from each other by a power of two.

In a fifth embodiment, in furtherance of any of the first to fourth embodiments, each non-volatile memory cell in the node has an adjustable resistor having a cross-sectional area. The cross-sectional area of the adjustable resistor of each non-volatile memory cell in the node is different in order to store a different bit of the multiplicand.

In a sixth embodiment, in furtherance of any of the first to fifth embodiments, the non-volatile memory cells in the node are ordered from a least significant bit to a most significant bit. The non-volatile memory cells in the node each comprise an adjustable resistor having a diameter. The diameter of the adjustable resistor in a memory cell is greater by a factor of approximately the square root of two relative to the adjustable resistor in a previous memory cell going from the least significant bit to the most significant bit.

In a seventh embodiment, in furtherance of any of the first to sixth embodiments, the non-volatile memory cells in the node are ordered from least significant bit to most significant bit. The non-volatile memory cells each comprise a ferroelectric field effect transistor (FeFET), each FeFET having a width to length ratio (W/L). The W/L of the FeFETs doubles with each memory cell going from the least significant bit to the most significant bit.

In an eighth embodiment, in furtherance of any of the first to seventh embodiments, the multiply circuit is configured to simultaneously apply a different magnitude multiply voltage to each non-volatile memory cell in the node. The different magnitude multiply voltages have magnitudes that are different powers of two.

In a ninth embodiment, in furtherance of any of the first to eighth embodiments, the apparatus further comprises "n−1" additional nodes of non-volatile memory cells. Each memory cell in the "n−1" additional nodes is associated with the bit line, wherein "n" nodes of memory cells are associated with the bit line. The write circuit is further configured store a multiplicand in corresponding ones of the "n−1" additional nodes, wherein each memory cell in the "n−1" nodes stores a different bit of its multiplicand, wherein the "n" nodes of memory cells store a first vector. The multiply circuit is further configured to simultaneously apply "n" sets of one or more multiply voltages to memory cells in corresponding ones of the "n" nodes of memory cells. Each memory cell in each node is configured to pass a memory cell current that represents a product of set of one or more bits of the multiplicand stored in the memory cell and an element of a second vector. The second vector represented by the "n" sets one or more multiply voltages. The sense circuit is further configured to sense a magnitude of a vector current in the bit line that results from the multiply circuit simultaneously applying a multiply voltage to each memory cell in the "n" nodes. The magnitude of the bit line vector current representing a product of the first vector and second vector.

One embodiment includes a non-volatile storage device, comprising a conductive line, "n" nodes of "r" binary non-volatile memory cells, and one or more control circuits in communication with the conductive line and the "n" nodes of "r" binary non-volatile memory cells. Each memory cell in the "n" nodes is electrically connected to the conductive line. Each memory cell has an on-current and an off-current. The memory cells in a node have "r" different on-currents. The "r" different on-currents for a node comprise a sequence in which the current magnitude is twice the current magnitude of the previous current in the sequence. The one or more control circuits are configured to store a first vector having "n" elements in the "n" nodes of non-volatile memory cells, including store one of the "n" elements into each of the "n" nodes of memory cells. The one or more control circuits are configured to simultaneously apply "n" multiply voltages to the corresponding "n" nodes of non-volatile memory cells, wherein each non-volatile memory cell provides either the on-current or the off-current to the conductive line in response to the multiply voltage applied to the memory cell. Each of the "n" multiply voltages is based on one of "n" elements of a second vector. The one or more control circuits are configured to determine a total magnitude of the memory cell currents from all non-volatile memory cells in the "n" nodes. The total magnitude represents a product of the first vector and the second vector.

One embodiment includes a non-volatile storage device, comprising a plurality of first conductive lines comprising a set of "r" first conductive lines, wherein "r" is an integer greater than "1". The non-volatile storage device also includes a plurality of non-volatile memory cells, comprising a node of "r" non-volatile memory cells, each memory cell in the node connected to one of the first conductive lines in the set of "r" first conductive lines. The non-volatile storage device also includes a second conductive line connected to the node of "r" memory cells. The non-volatile storage device also includes one or more control circuits in communication with the plurality of first conductive lines and the second conductive line. The one or more control circuits are configured to store a multiplicand in the node of "r" memory cells. The one or more control circuits are configured to simultaneously apply a different one of "r" multiply voltages to each of the "r" memory cells in the node. Each non-volatile memory cell in the node causes a current in the second conductive line in response to the multiply voltage applied to the memory cell. The "r" multiply voltages each represent the same multiplier. The "r" multiply voltages comprise a sequence in which the voltage magnitude is one half the voltage magnitude of the previous voltage in the sequence. The one or more control circuits are configured to determine a total current in the second conductive line from each memory cell in the node. The total current representing a product of the multiplier and the multiplicand.

One embodiment includes a method of operating non-volatile storage. The method comprises digitizing each element of a first vector having "n" elements into "r" bits. The method also comprises programming the first vector into "n" nodes of non-volatile memory cells, comprising programming a different bit of one of the "n" elements into each non-volatile memory cell in a node. Each memory cell in the "n" nodes is associated with the same bit line. Each memory cell in the "n" nodes is programmed to either a high current state or a low current state. The method also comprises simultaneously applying "n" sets of one or more multiply voltages to corresponding ones of the "n" nodes of non-volatile memory cells. Each memory cell has one multiply voltage applied and is configured to provide a current to the bit line in response to the applied multiply voltage. The "n" sets of one or more multiply voltages represent a second vector having "n" elements. The method also comprises sensing a total current that results in the bit line from simultaneously applying the "n" sets of one or more multiply voltages to the "n" nodes of non-volatile memory cells. A magnitude of the sensed total current represents a dot product of the first vector and the second vector.

One embodiments includes a non-volatile memory system, comprising: a plurality of non-volatile memory cells, comprising "n×m" nodes of "r" memory cells; "m" bit lines, each bit line associated with "n" of the nodes of memory cells; and program means for storing a multiplicand in each of the "n×m" nodes of "r" memory cells. The program means for storing a different bit of the multiplicand in a binary number system in each memory cell of a node. The multiplicands in the "n×m" nodes represent an "n×m" matrix. The non-volatile memory system also includes multiplying means for simultaneously applying ones of "n" sets of one or more multiply voltages to "n×m" nodes of the memory cells. Each of the sets representing one element of a first vector having "n" elements. Each memory cell in the "n×m" nodes configured to pass a current to one of the "m" bit lines in response to the multiply voltage applied to the memory cell that represents a product of the bit stored in the memory cell and an element in the first vector. The non-volatile memory system also includes result means for generating a second vector having "m" elements. Each element of the second vector is based on the current in one of the "m" bit lines. The second vector represents multiplication of the "n×m" matrix by the first vector.

In one embodiment, the program means comprises one or more of memory core control circuits 108, address decoders 120, voltage generators 132, voltage generators for selected control lines 132a, voltage generators for unselected control lines 132b, signal generator for reference signals 132c, transfer data latch 148, write circuit 146, state machines, page registers, control circuitry, and/or sense amplifiers. The program means may comprise other hardware and/or software.

In one embodiment, the multiplying means comprises one or more of memory core control circuits 108, address decoders 120, voltage generators 132, voltage generators for selected control lines 132a, voltage generators for unselected control lines 132b, signal generator for reference signals 132c, transfer data latch 148, multiply circuit 146, state machines, page registers, control circuitry, and/or sense amplifiers. The multiplying means may comprise other hardware and/or software.

In one embodiment, the result means comprises one or more of memory core control circuits 108, signal generator for reference signals 132c, state machines, control circuitry, sense amplifiers, and/or digital to analog converters. The result means may comprise other hardware and/or software.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application, to thereby enable others skilled in the art to best utilize the technology in various embodiments and with various modifications as are suited to the particular use contemplated. The scope of the technology is defined by the claims appended hereto.

The invention claimed is:

1. An apparatus, comprising:
a node of memory cells, the memory cells reside in a cross-point array having rows of memory cells and columns of memory cells;
a bit line associated with the node of memory cells;
a write circuit configured to store a multiplicand in the node of memory cells, the write circuit configured to store a different set of one or more bits of the multiplicand in each memory cell of the node;
a multiply circuit configured to simultaneously apply a multiply voltage to each memory cell in the node, each memory cell configured to pass a memory cell current to the bit line that represents a product of a multiplier and the set of one or more bits of the multiplicand stored in the memory cell, the multiplier represented by a magnitude of the multiply voltage applied to each respective memory cell; and
a sense circuit configured to sense a magnitude of a total current in the bit line that results from the multiply circuit simultaneously applying a multiply voltage to each memory cell in the node, the magnitude of the total bit line current representing a product of the multiplier and the multiplicand.

2. The apparatus of claim 1, wherein:
each memory cell in the node is in a different row of the cross-point array.

3. The apparatus of claim 1, wherein:
the node of memory cells comprises "r" memory cells;
the write circuit is further configured to digitize the multiplicand into "r" bits; and
the write circuit is further configured to store one of the "r" bits into each of the "r" memory cells in the node.

4. The apparatus of claim 1, wherein:
each memory cell in the node has an on-current having a magnitude and an off-current; and
the magnitudes of the on-currents of the memory cells in the node differ from each other by a power of two.

5. The apparatus of claim 1, wherein:
each memory cell in the node has an adjustable resistor having a cross-sectional area, the cross-sectional area of the adjustable resistor of each memory cell in the node is different in order to store a different bit of the multiplicand.

6. The apparatus of claim 1, wherein:
the memory cells in the node are ordered from a least significant bit to a most significant bit;
the memory cells in the node each comprise an adjustable resistor having a diameter; and
the diameter of the adjustable resistor in a memory cell is greater by a factor of approximately the square root of two relative to the adjustable resistor in a previous memory cell going from the least significant bit to the most significant bit.

7. The apparatus of claim 1, wherein:
the memory cells in the node are ordered from least significant bit to most significant bit;
the memory cells each comprise a ferroelectric field effect transistor (FeFET), each FeFET having a width-to-length ratio (W/L); and
the W/L of the FeFETs doubles with each memory cell going from the least significant bit to the most significant bit.

8. The apparatus of claim 1, wherein:
the multiply circuit is configured to simultaneously apply a different magnitude multiply voltage to each memory cell in the node, the different magnitude multiply voltages have magnitudes that are different powers of two.

9. The apparatus of claim 1, further comprising "n−1" additional nodes of memory cells, each memory cell in the "n−1" additional nodes associated with the bit line, wherein "n" nodes of memory cells are associated with the bit line, and wherein:
the write circuit is further configured store a multiplicand in corresponding ones of the "n−1" additional nodes, wherein each memory cell in the "n−1" nodes stores a different bit of its multiplicand, wherein the "n" nodes of memory cells store a first vector;
the multiply circuit further configured to simultaneously apply "n" sets of one or more multiply voltages to memory cells in corresponding ones of the "n" nodes of memory cells, each memory cell in each node configured to pass a memory cell current that represents a product of set of one or more bits of the multiplicand stored in the memory cell and an element of a second vector, the second vector represented by the "n" sets one or more multiply voltages; and
the sense circuit further configured to sense a magnitude of a vector current in the bit line that results from the multiply circuit simultaneously applying a multiply voltage to each memory cell in the "n" nodes, the magnitude of the bit line vector current representing a product of the first vector and the second vector.

10. A non-volatile storage device, comprising:
a conductive line;
"n" nodes of "r" binary non-volatile memory cells, each memory cell in the "n" nodes electrically connected to the conductive line, each memory cell having an on-current and an off-current, the memory cells in a node having "r" different on-currents, the "r" different on-currents for a node comprising a sequence in which the on-current magnitude is twice the on-current magnitude of the previous on-current in the sequence;
one or more control circuits in communication with the conductive line and the "n" nodes of "r" binary non-volatile memory cells, the one or more control circuits configured to:
store a first vector having "n" elements in the "n" nodes of non-volatile memory cells, including store one of the "n" elements into each of the "n" nodes of memory cells;
simultaneously apply "n" multiply voltages to the corresponding "n" nodes of non-volatile memory cells, wherein each non-volatile memory cell provides either the on-current or the off-current to the conductive line in response to the multiply voltage applied to the memory cell, wherein each of the "n" multiply voltages is based on one of "n" elements of a second vector; and
determine a total magnitude of the memory cell currents from all non-volatile memory cells in the "n" nodes, the total magnitude represents a product of the first vector and the second vector.

11. The non-volatile storage device of claim 10, wherein:
the one or more control circuits are further configured to, for each element of the first vector:
digitize the element into "r" bits; and
store one of the "r" bits of into each memory cell of one of the "n" nodes.

12. The non-volatile storage device of claim 10, wherein:
the binary non-volatile memory cells each comprise an adjustable resistor having a cross-sectional area; and
for a node of memory cells, each adjustable resistor has a cross-sectional area that is a different power of two times the cross-sectional area of a smallest adjustable resistor in the node.

13. The non-volatile storage device of claim 10, wherein:
the binary non-volatile memory cells each comprise a ferroelectric field effect transistor (FeFET) having a width-to-length ratio (W/L); and
for a node of memory cells, each FeFET has a (W/L) that is a different power of two times the W/L of a smallest FeFET in the node.

14. A non-volatile storage device, comprising:
a plurality of first conductive lines, comprising a set of "r" first conductive lines, wherein "r" is an integer greater than "1";
a plurality of non-volatile memory cells, comprising a node of "r" non-volatile memory cells, each memory cell in the node connected to one of the first conductive lines in the set of "r" first conductive lines;
a second conductive line connected to the node of "r" memory cells;
one or more control circuits in communication with the plurality of first conductive lines and the second conductive line, the one or more control circuits configured to:
store a multiplicand in the node of "r" memory cells;
simultaneously apply a different one of "r" multiply voltages to each of the "r" memory cells in the node, wherein each non-volatile memory cell in the node causes a current in the second conductive line in response to the multiply voltage applied to the memory cell, the "r" multiply voltages each representing the same multiplier, the "r" multiply voltages comprising a sequence in which the voltage magnitude is one half the voltage magnitude of the previous voltage in the sequence; and
determine a total current in the second conductive line from each memory cell in the node, the total current representing a product of the multiplier and the multiplicand.

15. The non-volatile storage device of claim 14, wherein the one or more control circuits are further configured to:
program each memory cell to either an on-state or an off-state in order to store a bit of the multiplicand into each memory cell.

16. The non-volatile storage device of claim 15, wherein the one or more control circuits are further configured to:
digitize information that represents the multiplicand into "r" bits.

17. The non-volatile storage device of claim 14, wherein:
plurality of first conductive lines comprise "n" sets of "r" first conductive lines;
the plurality of non-volatile memory cells comprise "n" nodes of "r" non-volatile memory cells, each node of "r" memory cells associated with one set of "r" first conductive lines, each memory cell in each of the "n" nodes connected to one of the first conductive lines;
the second conductive line is connected to each memory cell in the "n" nodes of "r" memory cells;
the one or more control circuits are further configured to:
store a different multiplicand in each of the "n" nodes of "r" memory cells;
simultaneously apply "n" sets of "r" multiply voltages to the "n" nodes of memory cells, the "r" multiply voltages for each of the "n" sets comprising a sequence in which the voltage magnitude is one half the voltage magnitude of the previous voltage in the sequence, wherein each non-volatile memory cell in the "n" nodes causes a current in the second conductive line in response to one of the applied multiply voltages, the "n" sets of "r" multiply voltages representing a vector having elements; and
sense a total current in the second conductive line that results from simultaneously applying the "n" sets of "r" multiply voltages to the "n" nodes of memory cells, a magnitude of the total current represents a multiply and accumulate of the elements of the vector multiplied by the multiplicands in the "n" nodes of memory cells.

18. A method of operating non-volatile storage, the method comprising:
digitizing each element of a first vector having "n" elements into "r" bits;
programming the first vector into "n" nodes of non-volatile memory cells, comprising programming a different bit of one of the "n" elements into each non-volatile memory cell in a node, each memory cell in the "n" nodes associated with the same bit line, wherein each memory cell in the "n" nodes is programmed to either a high current state or a low current state;
simultaneously applying "n" sets of one or more multiply voltages to corresponding ones of the "n" nodes of non-volatile memory cells, each memory cell having one multiply voltage applied and configured to provide a current to the bit line in response to the applied multiply voltage, the "n" sets of one or more multiply voltages representing a second vector having "n" elements; and
sensing a total current that results in the bit line from simultaneously applying the "n" sets of one or more multiply voltages to the "n" nodes of non-volatile memory cells, a magnitude of the sensed total current representing a dot product of the first vector and the second vector.

19. The method of claim 18, wherein:
the one or more multiply voltages in each of the "n" sets have magnitudes that are different powers of two.

20. A non-volatile memory system, comprising:
a plurality of non-volatile memory cells, comprising "n×m" nodes of "r" memory cells;
"m" bit lines, each bit line associated with "n" of the nodes of memory cells;
program means for storing a multiplicand in each of the "n×m" nodes of "r" memory cells, the program means for storing a different bit of the multiplicand in a binary number system in each memory cell of a node, the multiplicands in the "n×m" nodes representing an "n×m" matrix;
multiplying means for simultaneously applying ones of "n" sets of one or more multiply voltages to "n×m" nodes of the memory cells, each of the sets representing one element of a first vector having "n" elements, each memory cell in the "n×m" nodes configured to pass a current to one of the "m" bit lines in response to the multiply voltage applied to the memory cell that represents a product of the bit stored in the memory cell and an element in the first vector; and
result means for generating a second vector having "m" elements, each element of the second vector based on the current in one of the "m" bit lines, the second vector representing multiplication of the "n×m" matrix by the first vector.

* * * * *